US007505880B2

(12) United States Patent
Sasaki et al.

(10) Patent No.: US 7,505,880 B2
(45) Date of Patent: Mar. 17, 2009

(54) ANALYSIS METHOD, PROGRAM FOR PERFORMING THE METHOD, AND INFORMATION PROCESSING APPARATUS

(75) Inventors: Toyoshige Sasaki, Yokohama (JP); Ko Yoneda, Yokohama (JP); Takuma Onishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 580 days.

(21) Appl. No.: 11/135,159

(22) Filed: May 23, 2005

(65) Prior Publication Data

US 2005/0276616 A1 Dec. 15, 2005

(30) Foreign Application Priority Data

May 31, 2004 (JP) ............................. 2004-161587
May 31, 2004 (JP) ............................. 2004-161588

(51) Int. Cl.
*G06F 17/50* (2006.01)
*G11C 29/04* (2006.01)
*G03G 15/00* (2006.01)

(52) U.S. Cl. .................. 703/2; 703/17; 716/5; 365/201

(58) Field of Classification Search ..................... 703/2, 703/18, 17; 365/201; 716/5
See application file for complete search history.

(56) References Cited

U.S. PATENT DOCUMENTS

| | | | |
|---|---|---|---|
| 5,838,596 A | 11/1998 | Shimomura et al. | |
| 6,256,241 B1 * | 7/2001 | Mehalel | 365/201 |
| 6,314,545 B1 * | 11/2001 | Kapur et al. | 716/5 |
| 6,453,275 B1 * | 9/2002 | Schoenmaker et al. | 703/2 |

FOREIGN PATENT DOCUMENTS

| | | |
|---|---|---|
| JP | 9-309665 | 12/1997 |
| JP | 2003-262617 | 9/2003 |

OTHER PUBLICATIONS

311 Study on Separating Discharge in the Belt Transfer System used in Electrophotography Technique Masami Kadonaga, Tomomi Katoh, Tomoko Takahashi and Yumiko Kishi.

Yuko Hayama, Osamu Takehira, Masashi Kadonaga, "Toner Scattering Mechanism by Numberical Simulation of Electric Field near the Transfer nip Considering Paper Behavior", Ricoh Technical Report, No. 28, Dec. 2002, pp. 27-33.

Yoshio Watanabe, Kenji Okada, Masumi Sato, Shin-Ichi Namekata, "Numerical Simulation of Corona Devices in Electrophotography", Journal of the Society of Electrophotography of Japan, vol. 30, No. 4, Issue Number 971, 1991, pp. 439-444.

* cited by examiner

*Primary Examiner*—Thai Phan
(74) *Attorney, Agent, or Firm*—Canon U.S.A., Inc., IP Division

(57) ABSTRACT

An analysis method of analyzing a discharge phenomenon in an information processing apparatus having a memory includes calculating differences in potential between nodes on a first surface of a meshed simulation model and the corresponding nodes on a second surface thereof based on a predetermined amount of charge of each node before the discharge and the permittivity of each element of the simulation model; storing information concerning a pair of nodes having the difference in potential which exceeds a Paschen voltage determined from the distance between the nodes; and analyzing an amount of charge moved due to the discharge and electric potential distribution after the discharge based on the stored information and the amount of charge of each node before the discharge and storing the analyzed amount of charge and the electric potential distribution.

12 Claims, 15 Drawing Sheets

FIG. 4A
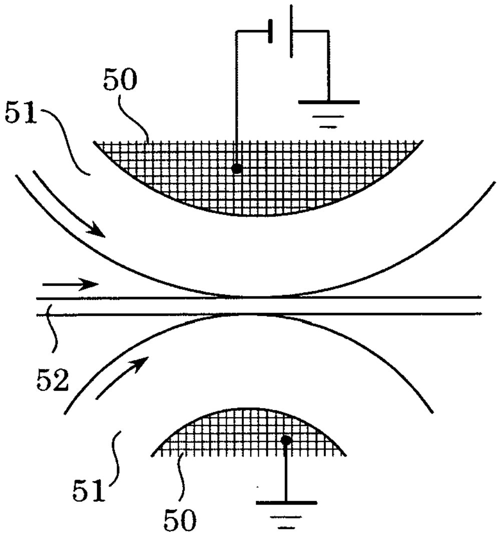
TRANSFER PROCESSING APPARATUS TO BE ANALYZED
FIG. 4B
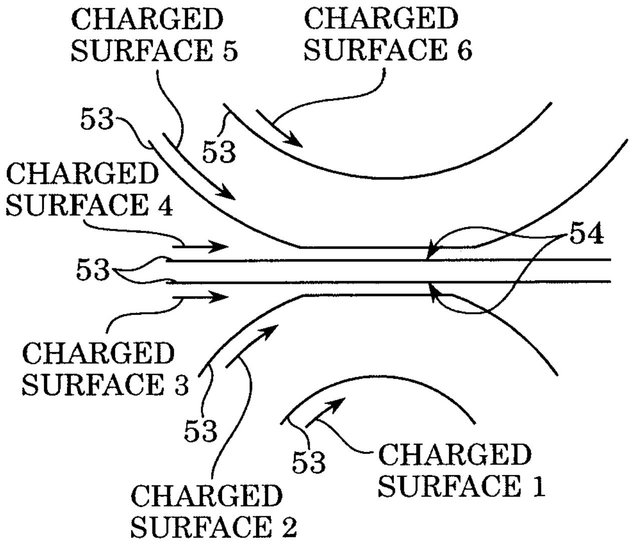
CALCULATION MODEL
FIG. 5A
FIG. 5B
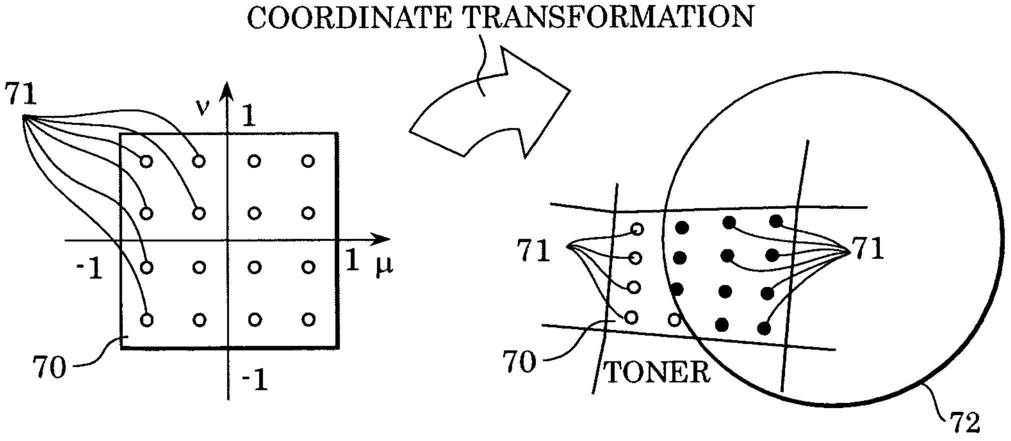
LOCAL COORDINATE
MODEL COORDINATE

BELT A

BELT C

| BELT | CALCULATION |
| --- | --- |
| A |   |
| C |   |

ANALYSIS METHOD, PROGRAM FOR PERFORMING THE METHOD, AND INFORMATION PROCESSING APPARATUS

BACKGROUND OF THE INVENTION

1. Field of the Invention

The present invention relates to an analysis method of analyzing discharge and an electric field of an apparatus.

2. Description of the Related Art

Image forming apparatuses, such as printers, copiers, and facsimile, using electrophotography have five processes including electrification, exposure, development, transfer, and cleaning.

The transfer process transfers a toner image formed on an image carrier to a transfer medium. In order to form a high-resolution image, it is desired to transfer the toner image to the transfer medium with higher transfer efficiency while suppressing toner spatter during the transfer. Accordingly, it is important to optimize various parameters, including the image carrier (photosensitive drum), the toner, the transfer medium, and transfer conditions.

Particularly, owing to popularization of color electrophotography, transfer methods using intermediate transfer members, such as intermediate transfer belts, are joining the mainstream in the transfer processes. In the transfer method using the intermediate transfer member, first, four-color toner images formed on the photosensitive member are sequentially superimposed and the superimposed toner image is subjected to primary transfer to the intermediate transfer belt. The images primarily transferred are finally and collectively subjected to secondary transfer to a final transfer medium, such as a transfer sheet, to form a final image. Accordingly, the two transfer processes are necessary to form the final image. In such a case, many parameters, including the photosensitive member, the toner, the intermediate transfer belt, the transfer sheet, and the transfer conditions in the primary and secondary transfer, are involved in the transfer efficiency in the two transfer processes.

Hitherto, the optimization of the various parameters in the transfer process has been mainly performed by experiment using, for example, a prototype apparatus. However, analysis using a computer also has come into use in recent years.

For example, a known technology calculates the electric potential distribution of a transfer apparatus in consideration of the current passing through the conductor, discharge, and the motion of an object. In this technology, a two-dimensional analysis area is divided into a plurality of small cells. A Poisson equation is used to calculate the electric potential of each cell by a finite difference method. The movement of the charge with the motion of, for example, the photosensitive drum or the intermediate transfer belt is calculated from the calculated electric potential distribution and the resistance of each member based on Ohm's law. The potential of each cell after the charge is moved is calculated, and the movement of the charge due to the discharge is calculated from the electric potential distribution based on Paschen's law and a capacitor theory. Repeating the cell division and the subsequent processes until the electric potential distribution becomes stable provides transfer electric field.

However, known technologies have the following problems.

Loose determination of an occurrence of the discharge is performed in the known technologies because the potential is defined at the center of each cell. In order to minimize the effect of the loose determination, it is necessary to divide the surface area of the object into small cells to calculate each value, thus requiring long calculation time.

In addition, since different methods of setting the discharge are used in different surface configuration of the object in the known technologies, specification for every simulation model is necessary and, therefore, an operator is required for complicated operation. Although the amount of electrostatic charge of the toner varies upon reception of the discharge, the discharge to the toner is not considered in the known technologies.

Since the known technologies use the theory of a capacitor having parallel electrodes to calculate the amount of charge that is moved due to the discharge, they are only applicable to a case in which the simulation model exhibits stratified material distribution having a uniform thickness in the direction of the electric line of force. Although the member, such as a static charge eliminator, using corona discharge is generally used in the transfer process, the analysis in consideration of the static charge eliminator is not discussed in the known technologies.

Furthermore, it is not possible to accurately reproduce the actual electric field distribution in the known technologies even when the calculation of the transfer electric field is performed.

It takes time for some materials used for, for example, the transfer rollers to exhibit dielectric polarization in response to the variation in the electric field. FIG. 24 is a graph schematically showing the variation in the amount of charge accumulated in electrodes with time when a step voltage is applied to a capacitor having parallel electrodes with the transfer roller sandwiched therebetween. Upon application of the voltage, charge Q1 is accumulated, the accumulated charge increases with time, and the charge remains constant at Q2. The charge decreases by the amount Q1 upon removal of the voltage, the charge gradually decreases with time, and finally falls into zero. Generally, the gradually increasing charge upon application of the voltage is called absorption charge and the gradually decreasing charge upon removal of the voltage is called residual charge. The curve of the absorption charge and the residual charge can be approximated by an exponential function. With respect to the material used for the transfer roller, the time constant of variation in the absorption charge and the residual charge is of the order of 0.1 seconds to several seconds. Such large time constant is caused by the long time until the material of the transfer roller exhibits the dielectric polarization.

This time constant is too large to be ignored, compared with the rotational speed of the transfer roller of a common electrophotographic apparatus. Specifically, a large electric field is generated near a nip on the transfer roller, whereas a small electric field is generated in the parts other than the nip. The large time constant of the dielectric polarization causes a phenomenon in which the dielectric polarization cannot catch up with the rotation of the transfer roller, which phenomenon has a large effect on the transfer performance.

SUMMARY OF THE INVENTION

The present invention provides a simulation system capable of accurately analyzing discharge and an electric field.

The present invention provides, in its first aspect, an analysis method of analyzing a discharge phenomenon in an information processing apparatus having a readable-writable memory. The analysis method includes calculating differences in potential between nodes on a first surface of a meshed simulation model and the corresponding nodes on a second surface thereof based on a predetermined amount of charge of each node before the discharge and the permittivity of each element of the simulation model; storing information concerning a pair of nodes having the difference in potential which exceeds a Paschen voltage determined from the distance between the nodes, among the calculated differences in potential; and analyzing an amount of charge that is moved due to the discharge and electric potential distribution after the discharge based on the stored information concerning the pair of nodes and the amount of charge of each node before the discharge and storing the analyzed amount of charge and the electric potential distribution.

The present invention provides, in its second aspect, an information processing apparatus of analyzing a discharge phenomenon. The information processing apparatus includes: a control unit calculating differences in potential between nodes on a first surface of a meshed simulation model and the corresponding nodes on a second surface thereof based on a predetermined amount of charge of each node before the discharge and the permittivity of each element of the simulation model; and a memory storing information concerning a pair of nodes having the difference in potential which exceeds a Paschen voltage determined from the distance between the nodes, among the calculated differences in potential. The control unit analyzes an amount of charge that is moved due to the discharge and electric potential distribution after the discharge based on the information concerning the pair of nodes, stored in the memory, and the amount of charge of each node before the discharge, and stores the analyzed amount of charge and the electric potential distribution in the memory.

Further features and advantages of the present invention will become apparent from the following description of exemplary embodiments with reference to the attached drawings.

BRIEF DESCRIPTION OF THE DRAWINGS

FIG. 4A is a schematic diagram of an information processing apparatus to be analyzed and FIG. 4B illustrates a simulation model of the information processing apparatus to be analyzed.

FIGS. 5A and 5B illustrate how the permittivity of an element is defined in consideration of the permittivity of toner.

DESCRIPTION OF THE EMBODIMENTS

Embodiments of the present invention will be described with reference to the attached drawings.

A discharge analysis method according to an embodiment of the present invention is characterized by yielding electric potential distribution when no discharge occurs, extracting discharge positions (a pair of discharge nodes) from the yielded electric potential distribution, and calculating how much electric charge is to be moved in order not to exceed a Paschen voltage. Formulas 3 and 4 described below are generated from the electric potential distribution when no discharge occurs and are solved simultaneously with an expression of electric field calculation.

Methods of simultaneously solving multiple types of formulas are already common. For example, such methods are used to determine deformation of a structure due to fluid flow or to impose a certain related condition on displacement between different nodes in structural analysis.

Multiple unknown amounts (for example, fluid pressure and structural displacement) are simultaneously solved or conditions are imposed on the relationship between the unknown amounts in such known methods. In contrast, conditional expressions are derived in advance by similar electric field calculations in the analysis method according the embodiment of the present invention. The analysis method of this embodiment apparently differs from the known methods and can solve the problems that cannot be solved by the known methods.

Figure 1:
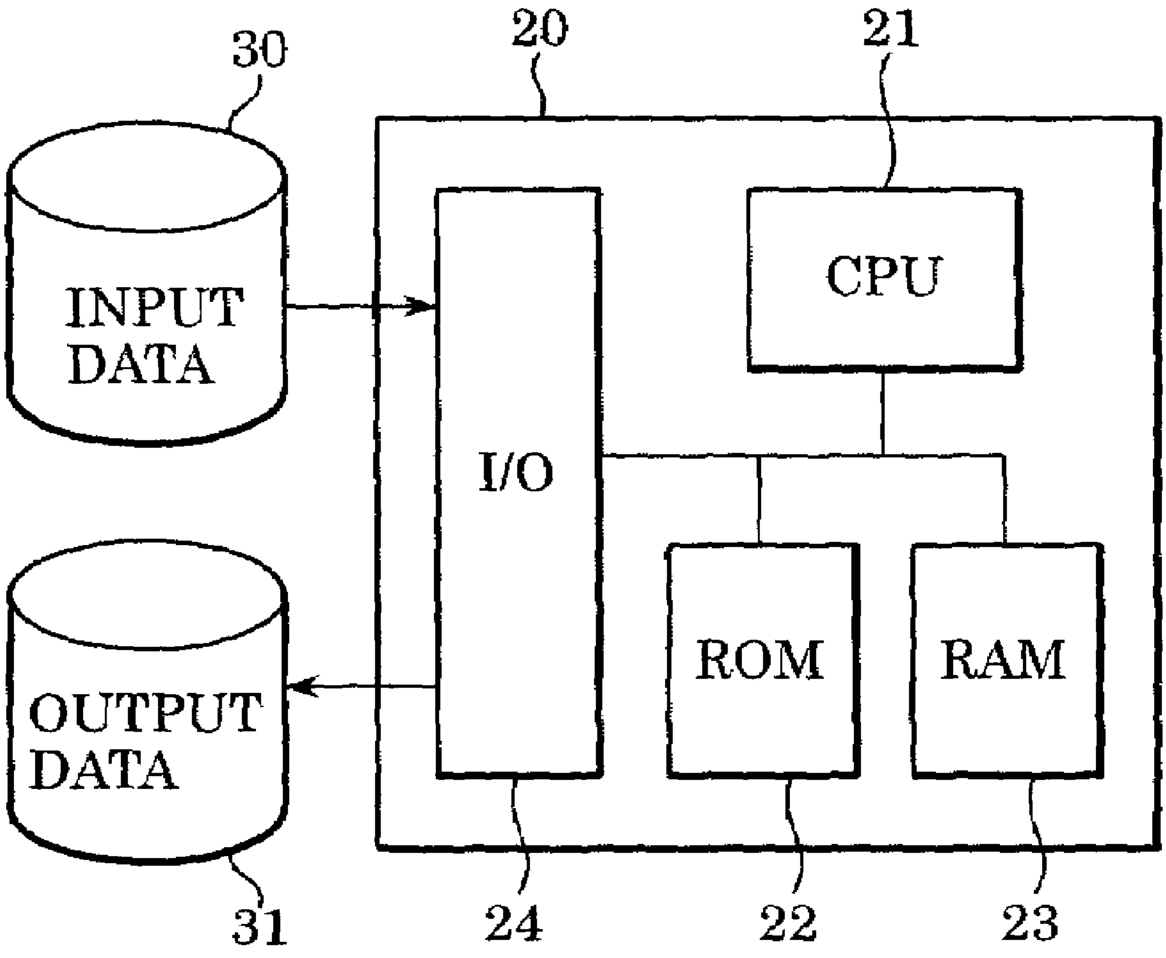
FIG. 1 is a block diagram showing an information processing apparatus according to an embodiment of the present invention.

FIG. 1 is a block diagram showing an information processing apparatus 20 according to an embodiment of the present invention. The information processing apparatus 20 includes a central processing unit (CPU) 21, a read only memory (ROM) 22 storing a software program and fixed data, a random access memory (RAM) 23 storing processing data and the like, and an input-output circuit (I/O) 24 through which data is transmitted to and received from an external storage device. The CPU 21 executes a control module performing a variety of determination and processing, a data input module for detecting input of data, a toner permittivity analysis module, a toner charge analysis module, a discharge analysis module, a toner behavior analysis module, a calculation result output module, and so on based on the software program. In the information processing apparatus 20, input data 30 is input through the I/O circuit 24 and the calculation result processed in the information processing apparatus 20 is output as output data 31 through the I/O circuit 24.

Figure 2:
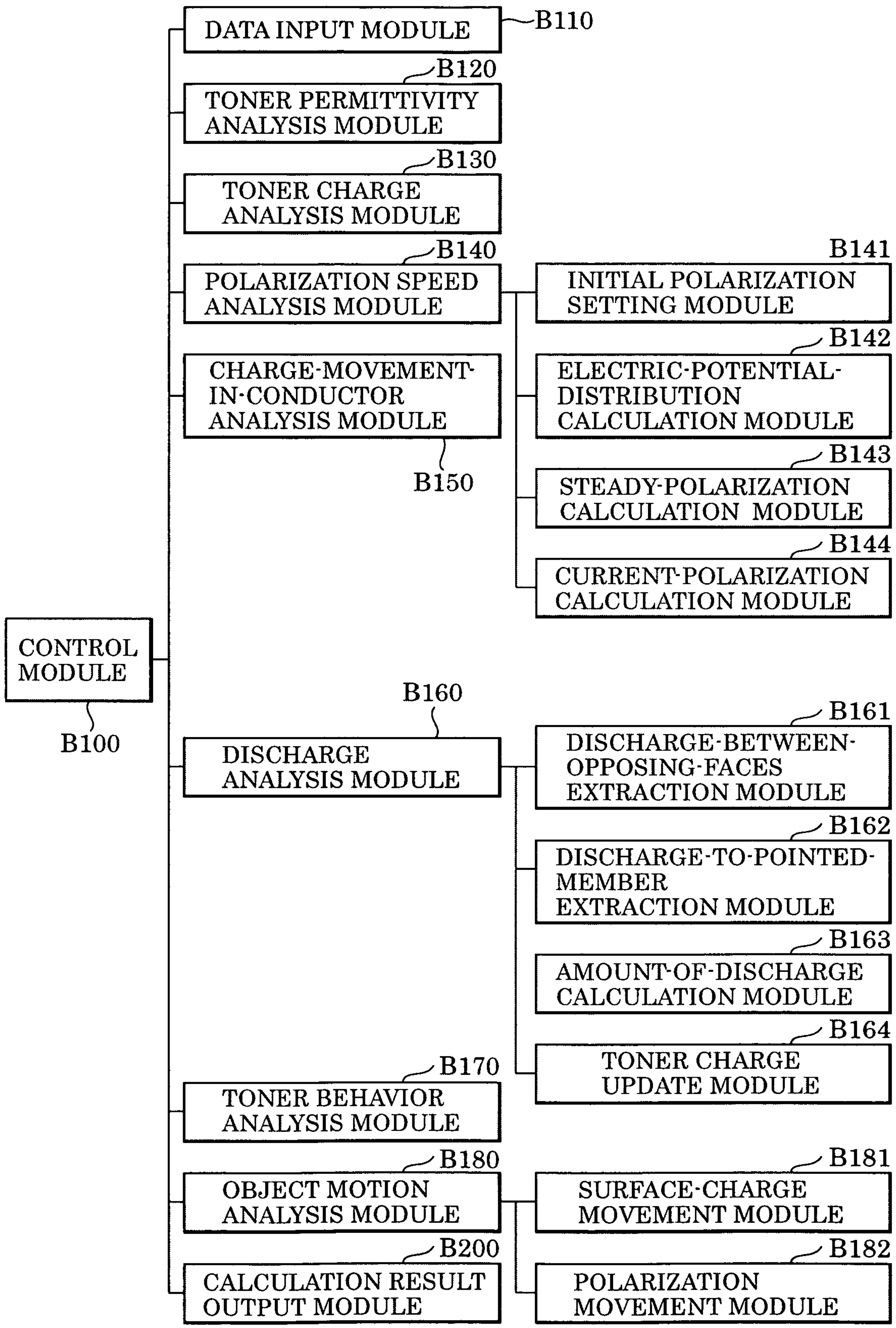
FIG. 2 shows the structure of modules of a program executed in the information processing apparatus, according to an embodiment of the present invention.

FIG. 2 shows the structure of modules of a software program executed by the information processing apparatus 20, according to an embodiment of the present invention.

A control module B100 controls the overall structure in order to analyze a transfer process. Specifically, the control module B100 controls a data input module B110, a toner permittivity analysis module B120, a toner charge analysis module B130, a polarization speed analysis module B140, a charge-movement-in-conductor analysis module B150, a discharge analysis module B160, a toner behavior analysis module B170, an object motion analysis module B180, and a calculation result output module B200, which will be described below.

The data input module B110 creates mesh data required for the analysis of this embodiment and data file including various parameters and stores the data in the RAM 23.

The mesh data, such as a finite difference mesh or a finite element mesh, is data in which the analysis area of a transfer apparatus made of a dielectric material or a resistor is divided into minor subareas depending on a method of performing the electric field calculation. The various parameters include the permittivity of the material, the conductivity thereof, the electric potential distribution thereof, the electric potential as a boundary condition, the speed of a moving object, specification of a surface on which electric charge is possibly accumulated (hereinafter referred to as a charged surface), specification of a surface where discharge occurs, the diameter of each toner particle, an initial arrangement of the toner, the amount of electrostatic charge of the toner, the permittivity of the toner, calculation pitch, and calculation ending time.

The toner permittivity analysis module B120 calculates data in which the distribution of the permittivity in the mesh data is associated with the permittivity of the toner, based on the position of each toner particle, the shape (diameter) of the toner particle, and the data concerning the permittivity of the toner particle.

The toner charge analysis module B130 calculates data in which the distribution of true electric charge in the mesh data is associated with the distribution of the electric charge of the toner.

The polarization speed analysis module B140 calculates polarization in consideration of the speed of dielectric polarization and also yields the electric potential distribution after the polarization. The polarization speed analysis module B140 includes an initial polarization setting module B141, an electric-potential-distribution calculation module B142, a steady-polarization calculation module B143, and a current-polarization calculation module B144. The initial polarization setting module B141 sets an initial polarization state of the dielectric material prior to calculation of the variation of the electric potential distribution with time. The electric-potential-distribution calculation module B142 performs electrostatic field calculation based on the polarization distribution, the distribution of the true charge, and the boundary condition of the potential to yield the electric potential distribution. The steady-polarization calculation module B143 calculates the polarization in a steady state in the current electric field. The current-polarization calculation module B144 calculates the current polarization based on the polarization in the previous calculation time step and the polarization in the steady state in the current electric field.

The charge-movement-in-conductor analysis module B150 calculates the charge movement in a conductor in accordance with Ohm's law.

The discharge analysis module B160 determines an occurrence of discharge to calculate the movement of the charge due to the discharge and to yield the electric potential distribution after the discharge. The discharge analysis module B160 includes a discharge-between-opposing-faces extraction module B161, a discharge-to-pointed-member extraction module B162, an amount-of-discharge calculation module B163, and a toner charge update module B164.

The discharge-between-opposing-faces extraction module B161 searches for an occurrence of discharge between two opposing surfaces in accordance with Paschen's law and extracts the discharge area. In the search for an occurrence of discharge, parts on or close to the surface where an occurrence of discharge is searched for are used, among parts where the potential as an unknown variable of the mesh data is defined, to extract a discharge definition segment, which has the maximum difference from the Paschen voltage, on the opposite surface for every potential definition segment. The part where the potential as the unknown variable of the mesh data is defined is hereinafter referred to as the potential definition segment or, simply, to a segment. The potential definition segment corresponds to the center of a cell in the finite difference method described in the related art and to a node in the finite element method. A segment on or close to the surface used in the search is referred to as a discharge search segment, the extracted potential definition segment is referred to as a discharge segment, and a pair of the discharge segment and the opposite segment is referred to as a pair of the discharge segments. Although any approximated curve expressing a Paschen voltage Vpa may be used, an approximated curve given by using Formula 1 is preferable.

$$\begin{cases} d < 4.53\times10^{-6} & V_{pa}[V] = 7.5\times10^{7}\times d \\ 4.53\times10^{-6} \le d < 87.64\times10^{-6} & V_{pa}[V] = 312.0 + 6.2\times10^{6}\times d \\ 87.64\times10^{-6} < d & V_{pa}[V] = 2.441\times10^{6}\times d + 6.73\times10^{4}\times\sqrt{d} + 0.001/d \end{cases} \quad \text{[Formula 1]}$$

where d denotes the length of a gap.

When the surface is covered with accumulated toner layers, the discharge-between-opposing-faces extraction module B161 excludes the potential definition segment covered with the toner layer from the search. The discharge-between-opposing-faces extraction module B161 associates a potential definition segment close to the toner (this potential definition segment is particularly referred to as a toner segment) with the surface toner, among the toner layers accumulated on the surface, instead of the excluded segment, and uses the toner segment in the search for an occurrence of the discharge.

The discharge-to-pointed-member extraction module B162 extracts a pair of discharge segments between two objects, such as a static charge eliminator, which do not conform to the Paschen's law, based on the experimental result indicating the relationship between the length of the gap and a discharge starting voltage. The amount-of-discharge calculation module B163 solves the discharge starting voltage and the relational expressions of the charge movement, shown in Formulas 3 and 4, for all the extracted pairs of the discharge segments simultaneously with a Poisson equation in Formula 2 to calculate the potential and the amount of discharge after the discharge.

In Formulas 2, 3, and 4, i and j denote potential definition segment numbers, Vth (ij) denotes a discharge starting voltage between the i and the j, Qi and Qj denote the amount of charge at the i and the j before the discharge, Q'i and Q'j denote the amount of charge at the i and the j after the discharge, and ΔQij denotes the amount of charge movement between the i and the j due to the discharge. α denotes a coefficient indicating the ratio of the voltage between the segments after the discharge with respect to the discharge starting voltage and is ordinarily equal to one. Specific examples of simultaneous equations will be described below. The amounts of charge in the discharge segments other than the toner segment are calculated by adding the amount of discharge yielded here, and the previous amounts of discharge are updated to the calculated amounts of charge.

$$\mathrm{div}(\in\cdot\mathrm{grad}\phi)=-\rho \quad \text{[Formula 2]}$$

$$\phi'_i-\phi'_j=\alpha V_{th}^{(ij)} \quad \text{[Formula 3]}$$

$$\begin{cases} Q'_i = Q_i - \Delta Q_{ij} \\ Q'_j = Q_j + \Delta Q_{ij} \end{cases} \quad \text{[Formula 4]}$$

The toner charge update module B164 adds the amount of discharge calculated by the amount-of-discharge calculation module B163 to the amount of charge of the toner from which a toner segment is extracted, when the potential definition segment where the distribution occurs is the toner segment, and updates the amount of charge of the toner.

The toner behavior analysis module B170 solves Newton equation of motion based on force, such as the electrostatic force, the gravity, the adhesion, and the air resistance, exerted on the toner to update the toner position to a position after the calculation pitch.

The object motion analysis module B180 analyzes the movement of the charge with the motion of an object. The object motion analysis module B180 includes a surface-charge movement module B181 and a polarization movement module B182. The surface-charge movement module B181 moves the true charge accumulated on the surface of the object with the motion of the object in the direction of the movement of the surface. The polarization movement module B182 moves the distribution of the polarization calculated by the polarization speed analysis module B140 in accordance with the motion of the object in the direction of the movement.

The calculation result output module B200 outputs results, including the electric potential distribution, the charge distribution, the toner behavior, the charge distribution of the toner, and the discharge distribution of the yielded calculation area.

A flowchart in the information processing apparatus when a toner transfer apparatus is simulated, according to an embodiment of the present invention, will be described below.

Simulation Process of Discharge

Figure 3:
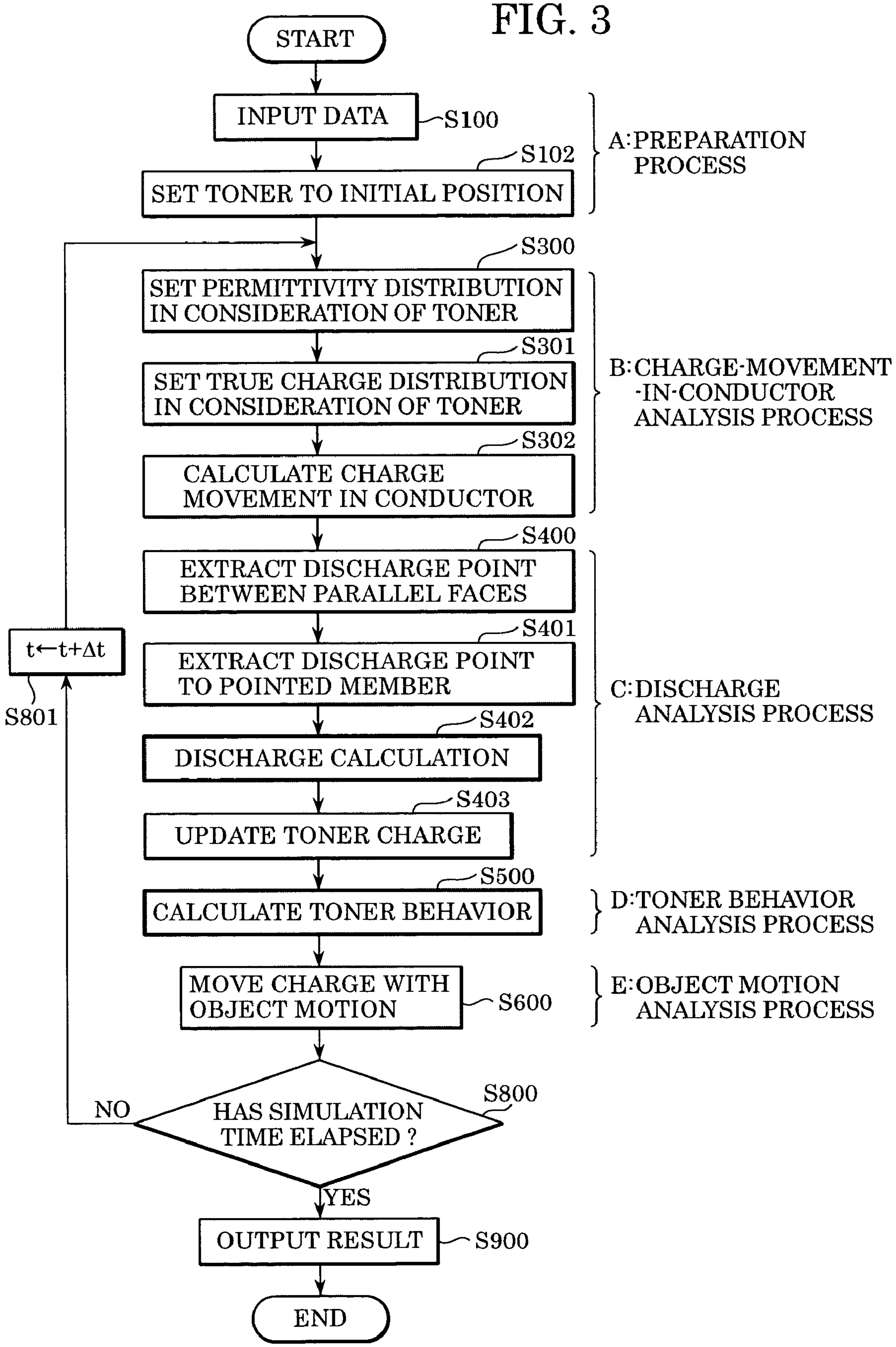
FIG. 3 is a flowchart showing a simulation process of discharge in the information processing apparatus.

FIG. 3 is a flowchart showing a simulation process of discharge in the toner transfer apparatus. The discharge simulation process is performed by executing the modules shown in FIG. 2.

In Step S100, the CPU 21 reads input data (the data input module B110). Simultaneously, the CPU 21 sets an initial charge distribution of, for example, latent images on a photosensitive drum. In Step S102, the CPU 21 sets the toner to an initial position in accordance with the conditions of the input data. Steps S100 and S102 are defined as A: preparation process for the calculation with time.

In Step S300, the CPU 21 sets permittivity distribution in consideration of the toner based on the input data in the toner permittivity analysis module B120. In Step S301, the CPU 21 sets true charge distribution in consideration of the toner charge based on the input data in the toner charge analysis module B130. In Step S302, the CPU 21 calculates an amount of charge movement in the conductor from the yielded permittivity distribution, the true charge distribution, and the dielectric polarization distribution in the charge-movement-in-conductor analysis module B150. Steps from S300 to S302 are defined as B: charge-movement-in-conductor analysis process.

In Step S400, the CPU 21 extracts a pair of the discharge segments (a pair of the discharge points between the parallel surfaces) in the discharge-between-opposing-faces extraction module B161. In Step S401, the CPU 21 extracts a pair of the discharge segments (a pair of the discharge points between the surface and the pointed member) in the discharge-to-pointed-member extraction module B162. In Step S402, the CPU 21 calculates the charge of all the potential definition segments in the amount-of-discharge calculation module B163. In Step S403, the CPU 21 updates the amount of charge of the toner where the discharge occurs in the toner charge update module B164. Steps from S400 to S403 are defined as C: discharge analysis process.

In Step S500, the CPU 21 calculates a behavior of the toner after a predetermined time in the toner behavior analysis module B170. The CPU 21 then updates the position of the toner to the position of the toner yielded in this toner behavior calculation. Step S500 is defined as D: toner behavior analysis process.

In Step S600, the CPU 21 moves the charge with the motion of an object (referring to the toner or each unit in a paper feed apparatus) in the object motion analysis module B180. The object motion analysis module B180 will be described in detail below. Step S600 is defined as E: object motion analysis process.

In Step S800, the CPU 21 determines whether a predetermined simulation time has elapsed. If the predetermined simulation time has not elapsed, the CPU 21 goes back to Step S300 to perform simulation at a time given by adding Δt to the time that has elapsed since the previous simulation starting time. The CPU 21 repeats the above processing until the predetermined time has elapsed. Then, in Step S900, the CPU 21 outputs the results of the simulation at the calculation ending time in the calculation result output module B200.

Analysis by Finite Element Method

A case in which the finite element method is adopted as the method of performing the electric field calculation in the analysis according to this embodiment will be exemplified below. The description is limited to two-dimensional analysis here.

When the Poisson equation in Formula 2 is solved by the finite element method, a potential $\phi$ and an electric charge (including polarization charge) Q are defined as values of a node described below, and a permittivity $\in$ and a conductivity $\sigma$ are defined as values of an element. Electric field strength is defined as a value of the element. The value at the center of the element is calculated here as the electric field strength.

The processing in the major modules in FIG. 2 in the analysis using the finite element method will be described below.

The object motion analysis module B180 will now be described. The electric charge ordinarily exists only on the surface of an object. A surface on which electric charge is possibly accumulated is referred to as the charged surface, as described above. When the motion of an object is taken into consideration, the charge should be moved in the direction of the object's motion between nodes on the charged surface. FIGS. 4A and 4B show examples of the charged surface. FIG. 4A is a diagram in which rollers are substituted for the photosensitive drums in a transfer processing apparatus to be analyzed. Referring to FIG. 4A, the transfer processing apparatus mainly includes rollers 51, core bars 50, and a sheet material 52. In the actual operation of the transfer processing apparatus, the two rollers 51 rotate with the sheet material 52 sandwiched therebetween and a voltage is applied to both the rollers 51. FIG. 4B shows a simulation model of the transfer processing apparatus. In this simulation model, six charged surfaces 53 are defined as the surfaces of objects to be analyzed. Although the rollers actually adhere to the sheet material, it is assumed here that there is a narrow gap 54 between the sheet material and the respective rollers. In the object motion analysis module B180, the simulation is performed by moving the true charge on the charged surfaces in the direction of objects' motion.

The toner permittivity analysis module B120 will now be described. The permittivity of each element is determined based on the ratio of the area of a toner particle with respect to the area of the element. FIGS. 5A and 5B show an example in which square elements 70 are used to set the permittivity.

FIG. 5A illustrates elements (the square elements 70) in a local coordinate system. Points 71 indicated by small circles are regularly arranged in each element. The points 71 regularly arranged are referred to as grid points here. Each grid point is arranged at the position indicated by a circle in a finite element shown in FIG. 5B by converting the grid point into a value (xs, ys) in a model coordinate system by using Formula 5. In Formula 5, Mn denotes the number of nodes in one element, Nl denotes a shape function of the element, and (xl, yl) denotes the coordinate of each node in the element.

$$\begin{cases} x_s = \sum_{l=1}^{Mn} N_l x_l \\ y_s = \sum_{l=1}^{Mn} N_l y_l \end{cases} \quad \text{[Formula 5]}$$

$$\varepsilon = \frac{\varepsilon_{air} \cdot n_0 + \varepsilon_{toner} \cdot n_1}{n_0 + n_1} \quad \text{[Formula 6]}$$

where $\in$air denotes the permittivity of air and $\in$toner denotes the permittivity of the toner.

In the manner described above, the permittivity of the element can be accurately defined based on the ratio of the area of the toner models with respect to the area of the element. Similarly, also in the case of triangle elements or two-dimensional elements, the permittivity can be defined from the ratio of the area of points, which are defined in each element at regular intervals, in the toner particle. The toner permittivity analysis module B120 performs this processing for all the elements of the material on which the toner moves to yield accurate distribution of the permittivity of each element in consideration of the permittivity of the toner.

Although the case in which the toner has one kind of permittivity is described, the toner permittivity analysis module B120 supports a case in which the toner has several kinds of permittivities.

Figure 6:
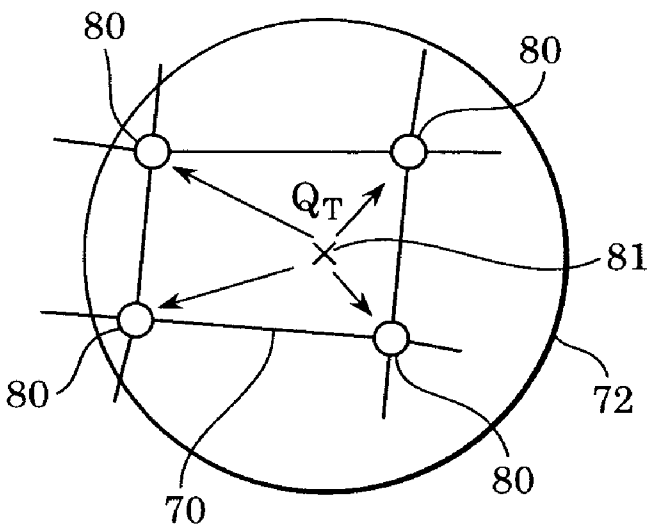
FIG. 6 illustrates the allocation of toner charge to each node.

The toner charge analysis module B130 will now be described. When a charged toner particle exists, the toner charge analysis module B130 allocates the charge at the center of the toner particle among nodes close to the center. The allocation of the charge of the toner particle among the nodes will be described with reference to FIG. 6. An element 70 produced by mesh division, nodes 70 of the element, a circle 72 indicating a toner particle, and the center 81 of the toner particle are shown in FIG. 6. It is assumed that the toner particle has the amount of charge QT. The toner charge analysis module B130 allocates the charge among the nodes 80 of the element 70 including the center 81 of the toner particle. The allocation is performed by using Formula 7.

$$Q_l = N_l Q_T \quad \text{[Formula 7]}$$

where Ql denotes the amount of charge allocated to the l-th node and Nl denotes a shape function of the l-th node of the element including the center of the toner particle.

The toner charge analysis module B130 performs the allocation for all the toner particles and updates the amount of charge at the corresponding nodes to the toner charge.

The discharge analysis module B160 will now be described. Since the potential is defined at the node in the finite element method, the potential definition segment described above corresponds to the node. Accordingly, the above discharge segment is referred to as a "discharge node", the discharge search segment to be analyzed is referred to as a "discharge search node", the pair of the discharge segments is referred to as a "pair of discharge nodes", and the toner segment is referred to as a "toner node" in the following description.

The discharge-between-opposing-faces extraction module B161 will now be described. First, an operator specifies in advance two surfaces between which discharge possibly occurs, among the charged surfaces, in a simulation model of the transfer processing apparatus. The operator, then, extracts parts where the discharge possibly occur between the two surfaces based on the electric potential distribution for every simulation time step.

Figure 7:
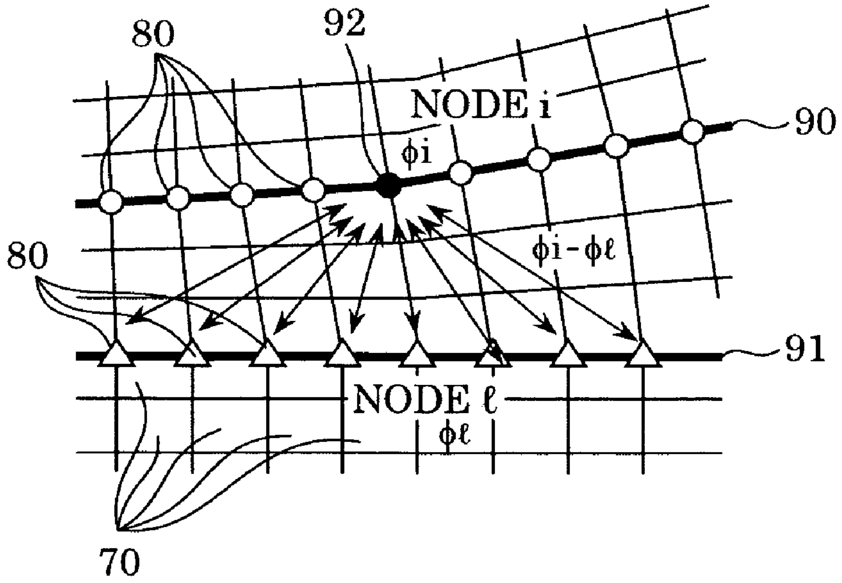
FIG. 7 shows a method of analyzing the discharge between two surfaces.

A method of extracting the parts where the discharge possibly occurs will be described with reference to FIG. 7. Referring to FIG. 7, charged surfaces 90 and 91 (thick lines), which are on the transfer processing apparatus and which are shown as part of the boundaries of elements 70 produced by the mesh division, correspond to the surfaces specified by the operator, between which surfaces the discharge possibly occurs. Nodes 80 exist on the charged surfaces 90 and 91. The nodes 80 indicated by circles are nodes on the charged surface 90 and the nodes 80 indicated by triangles are nodes on the charged surface 91.

As shown in FIG. 7, the discharge-between-opposing-faces extraction module B161 calculates a difference ϕi−ϕl in potential between the potential ϕi of a node i (reference numeral 92) on the charged surface 90 (the potential yielded based on Formula 2 from the permittivity calculated in the toner permittivity analysis module B120 and the charge calculated in the toner charge analysis module B130) and the potential ϕl of a node l on the charged surface 91 (the potential yielded based on Formula 2 from the permittivity calculated in the toner permittivity analysis module B120 and the charge calculated in the toner charge analysis module B130).

If the difference ϕi−ϕl in potential is larger than the Paschen voltage Vpa(il), which is determined by the distance (the length of the gap) between the nodes i and l and which is shown in Formula 1, the CPU 21 determines that the discharge occurs between the nodes. The CPU 21 performs the determination for all the nodes 80 on the charged surface 91. The CPU 21 registers the node l, which is larger than the Paschen voltage and which has the maximum difference from the Paschen voltage, in the RAM 23 as the node between which and the node i the discharge occurs in the form of the pair of discharge nodes. The CPU 21 performs the registration for all the nodes on the charged surface 90 to extract all the pairs of discharge nodes between the two nodes.

Although no restriction is imposed on the positional relationship between the pairs of discharge nodes to be registered in the above description, a restriction in that the difference in potential is calculated for only nodes on the charged surface 91, which nodes are connected to the nodes on the charged surface 90 through the straight lines that are within a predetermined angle with respect to the normal of the charged surface 90, may be imposed. This is because this restriction excludes the processing against strange discharge occurring when a complicated electric field exists in the gap to provide a result closer to a fact. Specifically, effective discharge is extracted while excluding the processing against the strange discharge when the predetermined angle is 30°.

In the simulation performed when the toner is accumulated on the charged surface, the CPU 21 sets the nodes in the surface layer of the toner, instead of the nodes on the charged surface, as the discharge search nodes in the area where the toner is accumulated. An example in which the discharge search nodes are extracted in consideration of the toner will be described with reference to FIG. 8.

Figure 8:
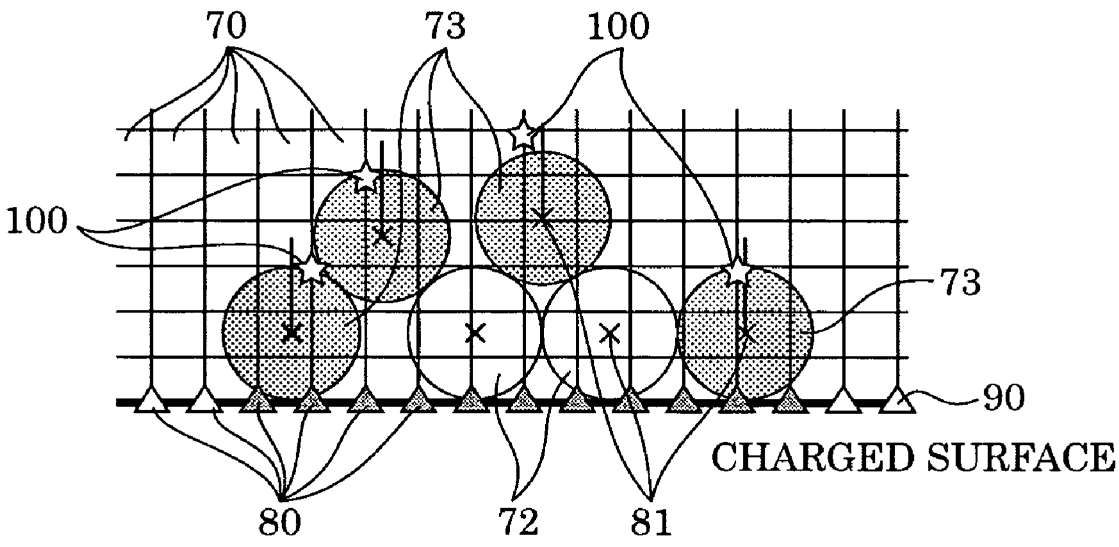
FIG. 8 is a diagram in which the accumulation of the toner is considered in the analysis of the discharge.

Elements 70, nodes 80 on the charged surface in a simulation model of the transfer processing apparatus, a charged surface 90 drawn by a thick line are illustrated in FIG. 8. The triangle nodes 80 denote nodes on the charged surface, spheres 72 and 73 denote toner particles, and points 81 in the toner particles denote the centers thereof. Although it is assumed here that the toner particles have the forms of spheres, the toner particles are shown by circles in FIG. 8. The CPU 21 extracts the discharge search nodes in the following sequence.

(1) All the nodes on the charged surface are registered in advance as the discharge search nodes.

(2) Among the toner particles accumulated on the charged surface, the toner particles in the surface layer are extracted. The extracted toner particles, in the surface layer, are denoted by hatched circles 73 and the remaining inside toner particles are denoted by white circles 72 in FIG. 8.

(3) Among the toner particles in the surface layer, nodes that are closest to the toner positions most apart from the charged surface are extracted as the toner nodes. Four nodes 100 denoted by star marks are extracted in FIG. 8. The extracted toner nodes are added as the discharge search nodes.

The CPU 21, then, excludes the nodes on the charged surface, covered with the toner, that is, the nodes on the charged surface, denoted by hatched triangles, from the discharge search nodes. Consequently, white triangles and nodes denoted by the star marks are the discharge search nodes on the charged surface in FIG. 8.

The pairs of discharge nodes are extracted, in the manner described above, based on the discharge search nodes extracted in the manner described with reference to FIG. 8.

The discharge-to-pointed-member extraction module B162 will now be described. The Paschen's law referred above comes into effect in a uniform electric field, for example, between parallel electrodes, and cannot be applied to a non-uniform electric field. Particularly, since the discharge of pointed member, such as static charge eliminator, which is often used in electrophotographic device, is corona discharge, the Paschen's law cannot be used. In a simulation model of the member to which the Paschen's law cannot be applied, a gap-length dependent curve of the discharge starting voltage yielded by experiment is used to extract the pairs of discharge nodes. An example of the static charge eliminator will be described below.

Figure 9:
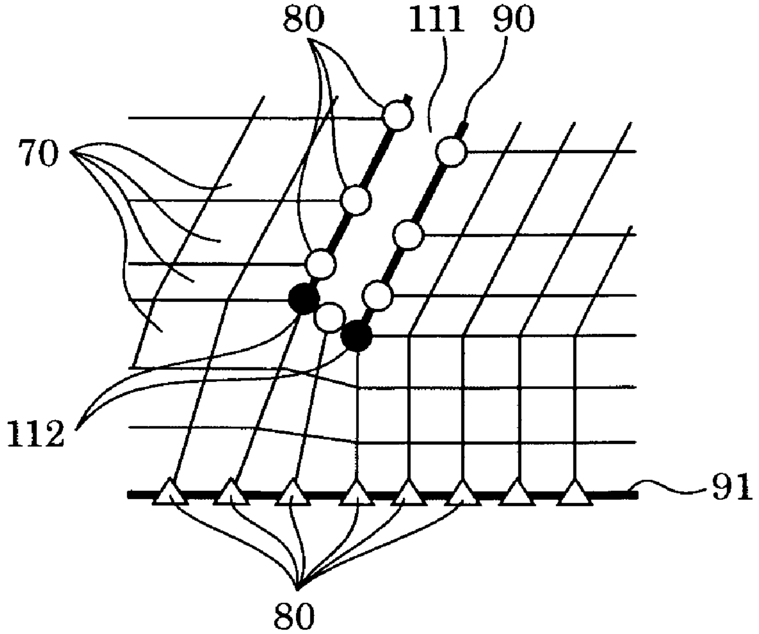
FIG. 9 illustrates a method of analyzing the discharge from a pointed member, such as a static charge eliminator.

FIG. 9 illustrates an example of an element division model of a static charge eliminator. Elements 70 produced by the mesh division, a static charge eliminator 111, a charged surface 90 on the surface of the static charge eliminator 111, a charged surface 91 opposing the static charge eliminator 111, and nodes 80 on the two charged surface 90 and 91 are shown in FIG. 9. Among the nodes 80, the nodes denoted by circles are nodes on the surface of the static charge eliminator 111 and the nodes denoted by triangles are nodes on the opposite surface 91.

The static charge eliminator 111 is assumed as a complete conductor and is not subjected to the element division. As in the discharge in accordance with the Paschen's law, the discharge between the charged surfaces 90 and 91 is checked in a manner described below by using the nodes on the charged surface 90 of the static charge eliminator 111 and those on the charged surface 91 opposing the charged surface 90, that is, by using the nodes denoted by the circles and the triangles, as the discharge search nodes to extract the pairs of discharge nodes.

Figure 10:
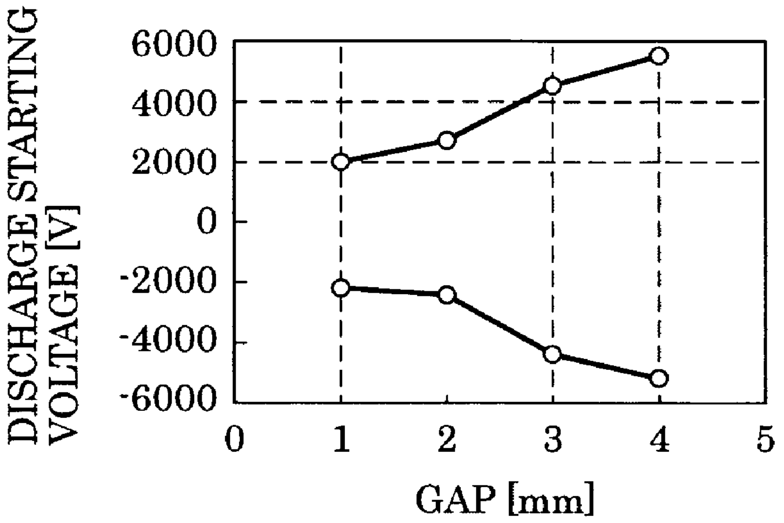
FIG. 10 illustrates an example of the relationship between the discharge starting voltage of the pointed member and the length of a gap between the pointed member and the opposite charged surface.

A method of extracting the pairs of discharge nodes in the simulation according to this embodiment will be described. FIG. 10 illustrates curves, given by experiment, indicating the relationship between the discharge starting voltage of the static charge eliminator and the length of the gap between the static charge eliminator and the charged surface. Since the discharge characteristic when the static charge eliminator has positive polarization is different from that when the static charge eliminator has negative polarization, the two curves are shown in FIG. 10. That is, either of the two curves is used based on the difference in potential between the static charge eliminator and the opposite surface. The CPU 21 registers the two discharge search nodes in the RAM 23 as the pair of discharge nodes when the difference in potential between the two discharge search nodes exceeds the voltage on the selected curve.

Since the discharge occurs in the pointed part at the tip of the static charge eliminator, only the pointed parts are considered as the discharge search nodes. Referring to FIG. 9, only the nodes 112 denoted by black circles are candidates for the discharge search nodes. The consideration of only the pointed parts allows the electric field distribution in the discharge of the static charge eliminator to be rapidly and accurately yielded.

Only the case in which the charged surface has one charged surface, between which surfaces the discharge possibly occurs, is exemplified in the above descriptions of the discharge-between-opposing-faces extraction module B161 and the discharge-to-pointed-member extraction module B162. However, actually, the charged surface often has multiple charged surfaces, between which surfaces the discharge possibly occurs. According to the above method, it is possible to determine the possibility of the discharge between the nodes on one charged surface and the nodes on multiple charged surfaces to easily extract the pairs of discharge nodes. This embodiment of the present invention is applicable to the discharge between curved surfaces.

The amount-of-discharge calculation module B163 will now be described. In the processing in the amount-of-discharge calculation module B163, it is assumed that the pairs of discharge nodes between the parallel surfaces and between the surface and the pointed member have been already extracted in the discharge-between-opposing-faces extraction module B161 and the discharge-to-pointed-member extraction module B162 and that the extracted pairs of discharge nodes have been registered in the RAM 23. A process of calculating the amount of charge that is moved due to the discharge between the pairs of discharge nodes is performed here.

Figure 11:
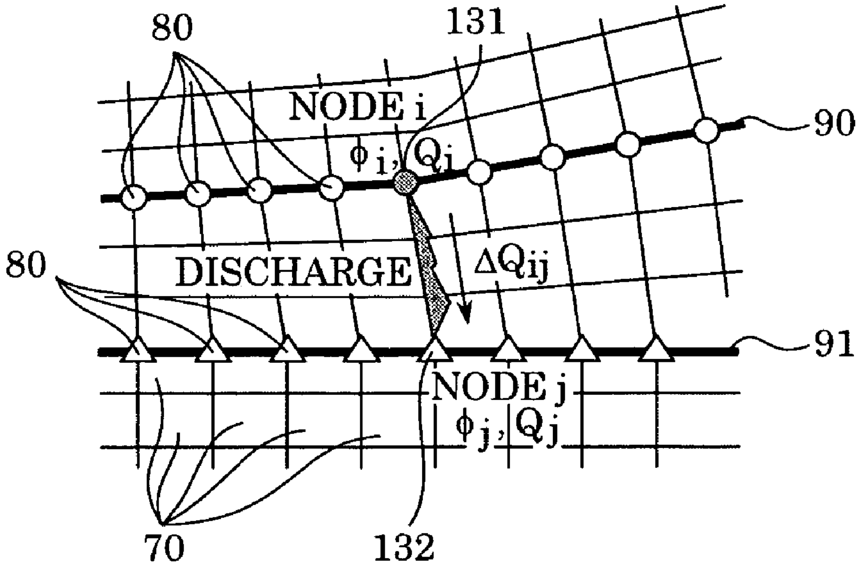
FIG. 11 illustrates a method of analyzing the discharge between two surfaces.

FIG. 11 illustrates an example in which the amount of charge that is moved due to the discharge is calculated. Since the reference numerals 70, 80, 90, and 91 in FIG. 11 are the same as in FIG. 9, a detailed description of such elements is omitted here. A node 131 on the charged surface 90 and a node 132 on the charged surface 91 form a pair of discharge nodes. The nodes 131 and 132 have node names i and j, respectively. The amount of charge that is moved due to the distribution with respect to this pair of discharge nodes is calculated in a manner described below.

Formula 8 is simultaneous linear equations given by discretizing the Poisson equation in Formula 2 by the finite element method after the allocation of boundary conditions. Formula 8 is called an overall second equation, where m denotes the number of nodes whose potentials are unknown.

$$\begin{bmatrix} K_{11} & \cdots & K_{1m} \\ \vdots & \ddots & \vdots \\ K_{m1} & \cdots & K_{mm} \end{bmatrix} \begin{Bmatrix} \phi_1 \\ \vdots \\ \phi_m \end{Bmatrix} = \begin{Bmatrix} Q_1 \\ \vdots \\ Q_m \end{Bmatrix} \quad \text{[Formula 8]}$$

In the following description, the potential vector and the charge vector before the discharge are denoted by {ϕ} and {Q}, respectively, and the potential vector and the charge vector after the discharge are denoted by {ϕ'} and {Q'}, respectively. The amounts of charge, before the discharge, of the pairs of discharge nodes i and j in FIG. 11 are denoted by Qi and Qj, respectively. Movement of the charge by an amount ΔQij from the node i to the node j due to the discharge generates a difference αVth in potential between the two nodes. The Vth(ij) denotes a discharge starting voltage in the length of the gap between the both the nodes. The Vth(ij) is equal to a Paschen voltage when the pair of discharge nodes is extracted in the discharge-between-opposing-faces extraction module B161, whereas the Vth(ij) is equal to the discharge starting voltage yielded by the above experiment when the pair of discharge nodes is extracted in the discharge-to-pointed-member extraction module B162. α denotes a coefficient indicating the ratio of a potential drop with respect to the Paschen voltage after the discharge. α ordinarily has a value of one.

The potentials ϕi' and ϕj' of the nodes i and j after the discharge have the relationship shown in Formula 3. The amounts of charge Qi' and Qj' are calculated by using Formula 4. Incorporating Formula 3 and Formula 4 into Formula 8 gives an electric field equation after the discharge shown in Formula 9.

$$\left[\begin{array}{ccccccc} K_{11} & \cdots & K_{1i} & \cdots & K_{1j} & \cdots & K_{1m} \\ \vdots & & \vdots & & \vdots & & \vdots \\ K_{i1} & \cdots & K_{ii} & \cdots & K_{ij} & \cdots & K_{im} \\ \vdots & & \vdots & & \vdots & & \vdots \\ K_{j1} & \cdots & K_{ji} & \cdots & K_{jj} & \cdots & K_{jm} \\ \vdots & & \vdots & & \vdots & & \vdots \\ K_{m1} & \cdots & K_{mi} & \cdots & K_{mj} & \cdots & K_{mm} \\ \hline 0 & \overset{\cdots}{0} & 1 & \overset{\cdots}{0} & -1 & \overset{\cdots}{0} & 0 \end{array}\right] \begin{Bmatrix} \phi'_1 \\ \vdots \\ \phi'_i \\ \vdots \\ \phi'_j \\ \vdots \\ \phi'_m \end{Bmatrix} = \begin{Bmatrix} Q_1 \\ \vdots \\ Q'_i \\ \vdots \\ Q'_j \\ \vdots \\ Q'_m \\ \hline \alpha V_{th}^{(ij)} \end{Bmatrix} = \begin{Bmatrix} Q_1 \\ \vdots \\ Q_i - \Delta Q_{ij} \\ \vdots \\ Q_j + \Delta Q_{ij} \\ \vdots \\ Q_m \\ \hline \alpha V_{th}^{(ij)} \end{Bmatrix} \quad \text{[Formula 9]}$$

where " . . . " in the m+1-th line are equal to zero.

Moving the ΔQij in the right-hand side vector to the left-hand side matrix gives Formula 10.

$$\left[\begin{array}{ccccccc|c} K_{11} & \cdots & K_{1i} & \cdots & K_{1j} & \cdots & K_{1m} & 0 \\ \vdots & & \vdots & & \vdots & & \vdots & \vdots 0 \\ K_{i} & \cdots & K_{ii} & \cdots & K_{ij} & \cdots & K_{im} & 1 \\ \vdots & & \vdots & & \vdots & & \vdots & \vdots 0 \\ K_{j1} & \cdots & K_{ji} & \cdots & K_{jj} & \cdots & K_{jm} & -1 \\ \vdots & & \vdots & & \vdots & & \vdots & \vdots 0 \\ K_{m1} & \cdots & K_{mi} & \cdots & K_{mj} & \cdots & K_{mm} & 0 \\ \hline 0 & \overset{\cdots}{0} & 1 & \overset{\cdots}{0} & -1 & \overset{\cdots}{0} & 0 & 0 \end{array}\right] \begin{Bmatrix} \phi'_1 \\ \vdots \\ \phi'_i \\ \vdots \\ \phi'_j \\ \vdots \\ \phi'_m \\ \hline \Delta Q_{ij} \end{Bmatrix} = \begin{Bmatrix} Q_1 \\ \vdots \\ Q_i \\ \vdots \\ Q_j \\ \vdots \\ Q_m \\ \hline \alpha V_{th}^{(ij)} \end{Bmatrix} \quad \text{[Formula 10]}$$

where " . . . " in the m+1-th line and the m+1-th column are equal to zero.

K in Formulae 9 and 10 denotes a coefficient depending on the left-hand side in Formula 2.

The left-hand side matrix in Formula 10 is given by adding one line having 1 and −1 in the two columns corresponding to the discharge node numbers and having zero in other elements and one column symmetric to the added line to the matrix in Formula 8. Solving Formula 10 gives the electric potential distribution {ϕ'} after the discharge and the amount of charge ΔQij that is moved due to the discharge.

Although the case in which one pair of discharge nodes exists is described, the electric potential distribution {ϕ'} after the discharge and the amount of charge {ΔQ} that is moved due to the discharge, when there are multiple pairs of discharge nodes, are calculated by repeating the line and column outside the m×m of the matrix by the number of pairs of discharge nodes in the same manner. In other words, a matrix that is generated by adding the lines and columns, which have 1 and −1 in the lines and columns corresponding to the node numbers and have zero in the remaining lines and columns, to each pair of discharge nodes by the number of pairs of discharge nodes should be solved.

After the amount of charge that is moved due to the discharge is calculated in the above manner, the amount-of-discharge calculation module B163 calculates the amount of charge after the discharge for the nodes other than the toner nodes, that is, for the nodes on the charged surface, by using Formula 4, and updates the amount of charge to the calculated amount of charge.

Since the matrix in the left-hand side in Formula 10 is a symmetric matrix, Formula 10 can be easily solved by, for example, a skyline method or an incomplete Cholesky conjugate gradient (ICCG) method, as in the common finite element method.

It is assumed that the discharge occurs between two nodes in the description regarding the discharge analysis module B160. However, when multiple pairs of segments having the Paschen voltage (the discharge starting voltage in the case of the discharge from the pointed member) exist, analyzing all the pairs of segments allows simulation in which the discharge occurs between one node and multiple nodes to be easily performed. A discharge result closer to the experimental result is calculated when the discharge occurs at a part closer to the pointed member.

As described above, an occurrence of the discharge is determined based on the search for the corresponding node on the opposite surface, which node satisfies the discharge condition to the highest level, for every node on the charged surface. Even when the discharge area is expanded, as in the discharge between rollers, the problems in the related art are not caused.

The use of the nodes on the two charged surfaces can achieve precise determination. Even when the elements on the surface of an object are coarsely divided, the discharge points can also be precisely extracted. An object having a complicated surface configuration can also be supported. Since the points where the discharge occurs are automatically determined in a program based on the relationship between the distance between both the nodes and the discharge starting voltage, instead of the surface configuration of the object, specification in accordance with the configuration of the model is not necessary, thus providing the user-friendly program.

Since fields satisfying Formulas 3 and 4 are directly calculated, it is possible to more precisely yield the electric potential distribution and the amount of discharge. In addition, the material distribution of any model is supported. There is no need to prepare additional data required to calculate the amount of charge that is moved due to the discharge, so that a more user-friendly program can be provided.

Since the discharge of member, such as the static charge eliminator, which does not conform to the Paschen's law can also be simulated, an actual transfer system can be analyzed without change, thus increasing the degree of practicality.

The toner charge update module B164 will now be described. When the node where the discharge occurs is a toner node, the toner charge update module B164 adds the amount of discharge ΔQ calculated in the amount-of-discharge calculation module B163 to the amount of charge of the toner from which the toner node is extracted, and updates the amount of charge to the calculated amount of charge. Since a correspondence table between the toner nodes and the toner numbers is required, the correspondence table is created in advance in the discharge-between-opposing-faces extraction module B161.

The toner behavior analysis module B170 will now be described. A spherical object, independent of the division model of the finite element method used in the above calculation of the electric field, is assumed as a toner particle. In the processing in the toner behavior analysis module B170, the toner position is updated to a position after the calculation pitch in consideration of the electrostatic force, the gravity, the adhesion, and the air resistance, which are exerted on the toner particle.

An electrostatic force Fe(t) exerted on the toner particle at a time t is calculated by using Formula 11.

$$F_e(t)=Q_T(t)E(t) \qquad \text{[Formula 11]}$$

where $Q_T$(t) denotes the amount of charge of the toner particle at a time t and E(t) denotes the electric field strength at the center of the toner particle at the time t.

The sum of force exerted on the toner particle, which includes the gravity, the adhesion, and the air resistance along with the electrostatic force Fe(t), is denoted by F(t). When the speed of the toner particle at the time t is denoted by v(t), the position x(t+dt) of the toner particle after a calculation pitch (dt) is calculated by using Formula 12 based on the Newton equation of motion. In Formula 12, v(t+dt) denotes the speed of the toner particle after the calculation pitch and m denotes the weight of the toner particle.

$$\begin{cases} v(t+dt) = v(t) + \dfrac{F(t)}{m}dt \\ x(t+dt) = x(t) + v(t)dt + \dfrac{1}{2}\dfrac{F(t)}{m}dt^2 \end{cases} \qquad \text{[Formula 12]}$$

The behavior of the toner particle is calculated by using Formulas 11 and 12. Specifically, either of a hard sphere model using the law of conservation of momentum and a rebound factor or a soft sphere model typified by a distinct element method may be adopted here.

The behavior of the toner particle is simulated in consideration of the sizes, the dielectric characteristics, and the charge of the individual toner particles in the toner permittivity analysis module B120, the toner charge analysis module B130, the toner charge update module B164, and the toner behavior analysis module B170. As a result, the operator can not only evaluate the transfer efficiency or directly evaluate the image which the toner provides, but also directly examine the cause of the formation of the image or the process of forming the image. Particularly, it is possible to calculate the discharge to the toner, which discharge has a serious effect on the transferred image, and the variation in amount of electrostatic charge of the toner that has received the discharge, thus accurately predicting the image in a design stage.

Figure 13:
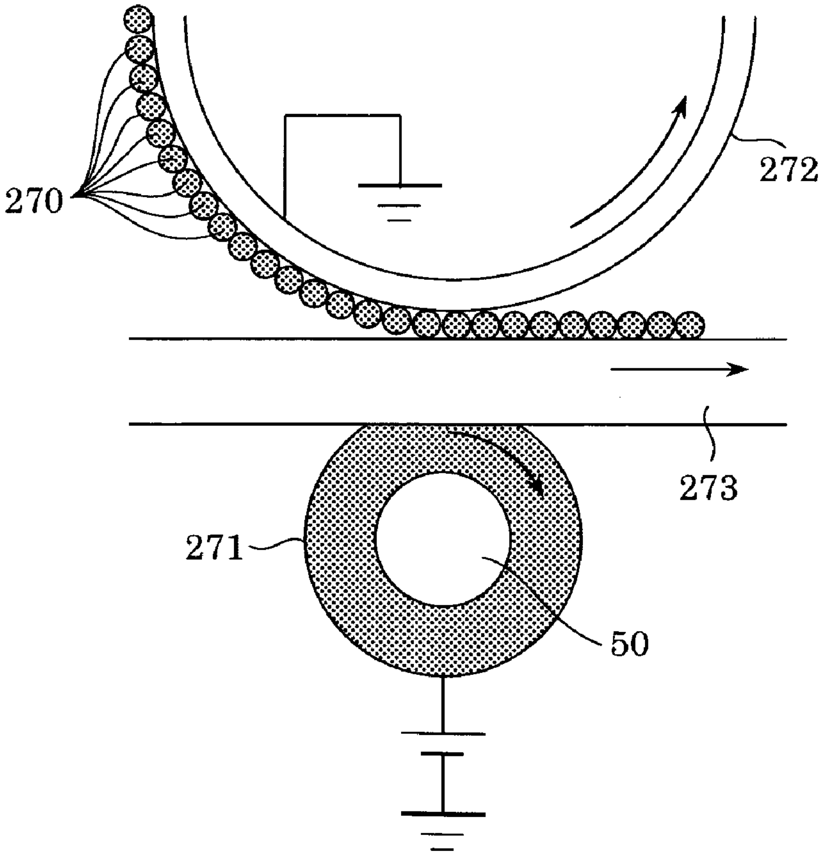
FIG. 13 is a schematic diagram showing a transfer apparatus.

FIG. 13 is a diagram showing a toner transfer apparatus, viewed from the axial direction of a photosensitive drum 272.

It is assumed that a transfer sheet 273 and the photosensitive drum 272 are moving from left to right in a transfer area. The toner 270 is negatively charged, the base of the photosensitive drum 272 is grounded, and a positive voltage is applied to a core bar 50 of a transfer roller 271. An electric field is formed between the photosensitive drum 272 and the transfer roller 271 to transfer the toner to the transfer sheet 273.

Figure 14:
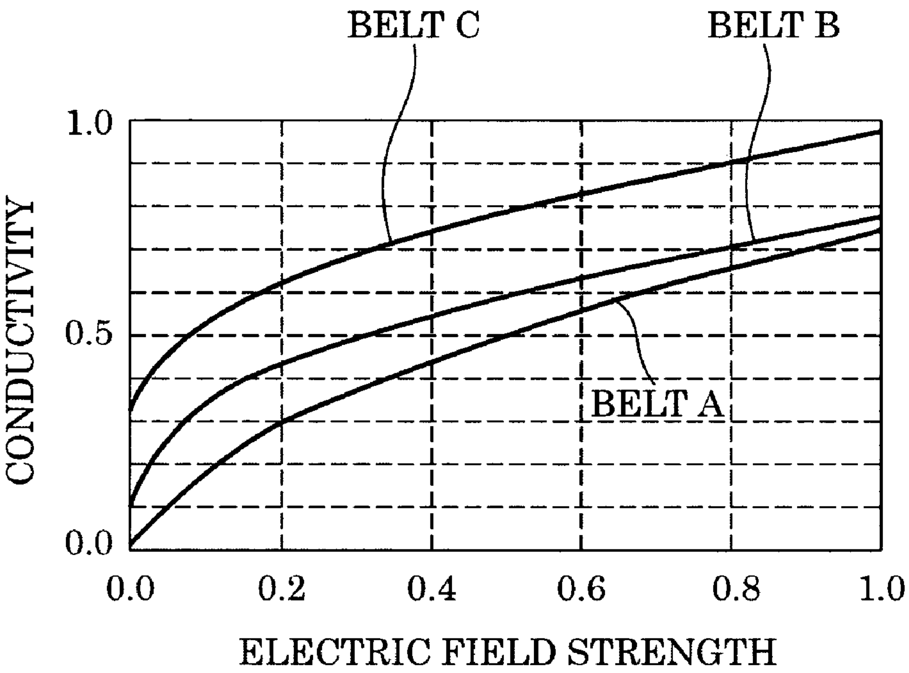
FIG. 14 is a graph showing the relationship between the electric field strength and the conductivity of transfer belts A to C.
Figure 15:
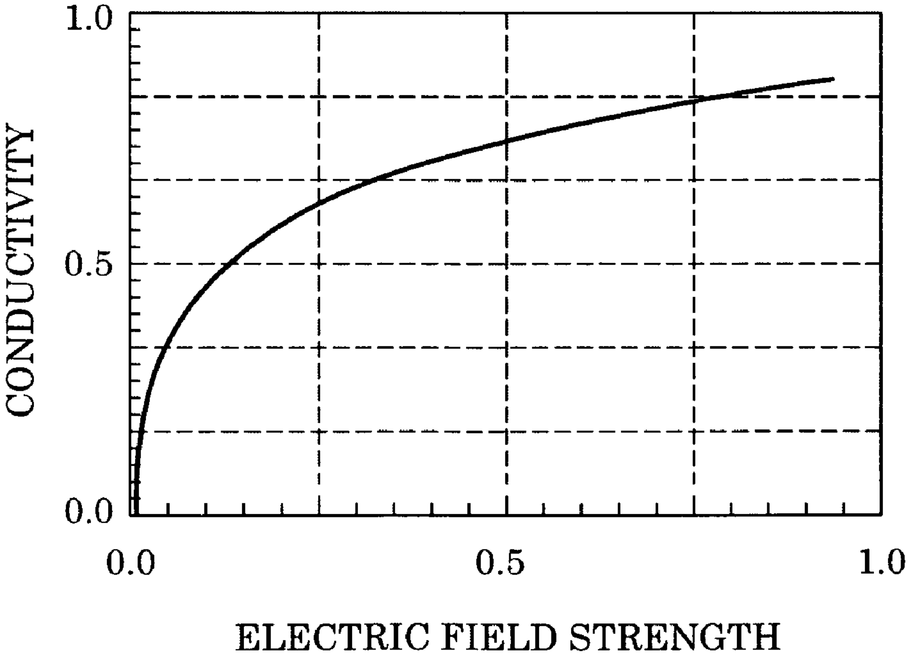
FIG. 15 is a graph showing the relationship between the electric field strength and the conductivity of a transfer roller.

Examples of results given by the simulation according to this embodiment in the simulation model of the toner transfer apparatus in FIG. 13 are shown in FIGS. 14 to 16. The image is primarily transferred on the transfer sheet 273 serving as an intermediate transfer belt.

FIG. 14 is a graph showing the dependence on the electric field of the conductivities of three kinds of intermediate transfer belts (referred to as belts A, B, and C) used in the calculation. FIG. 15 is a graph showing the dependence of the conductivity of the transfer roller on the electric field. The values along each axis are standardized for display.

Figure 16A:
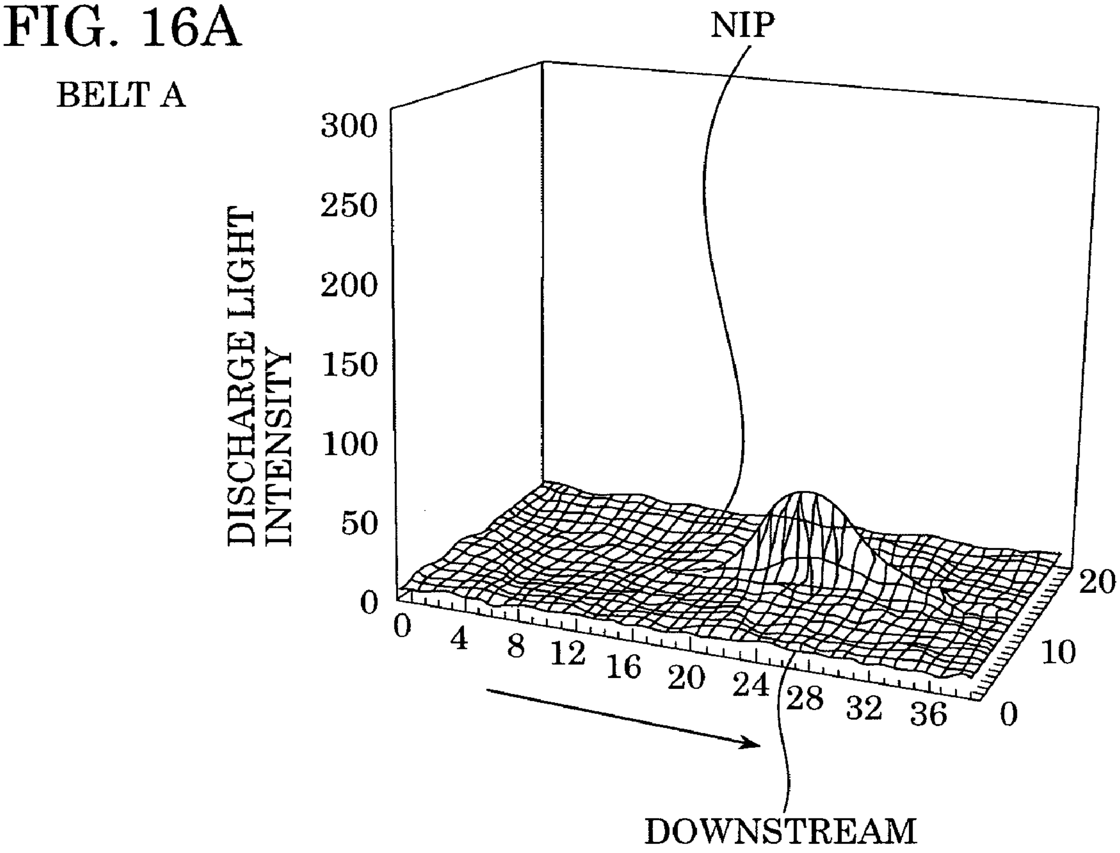
FIGS. 16A and 16B are three-dimensional graphs showing experimental results of the discharge light strength of the transfer roller.
Figure 16B:
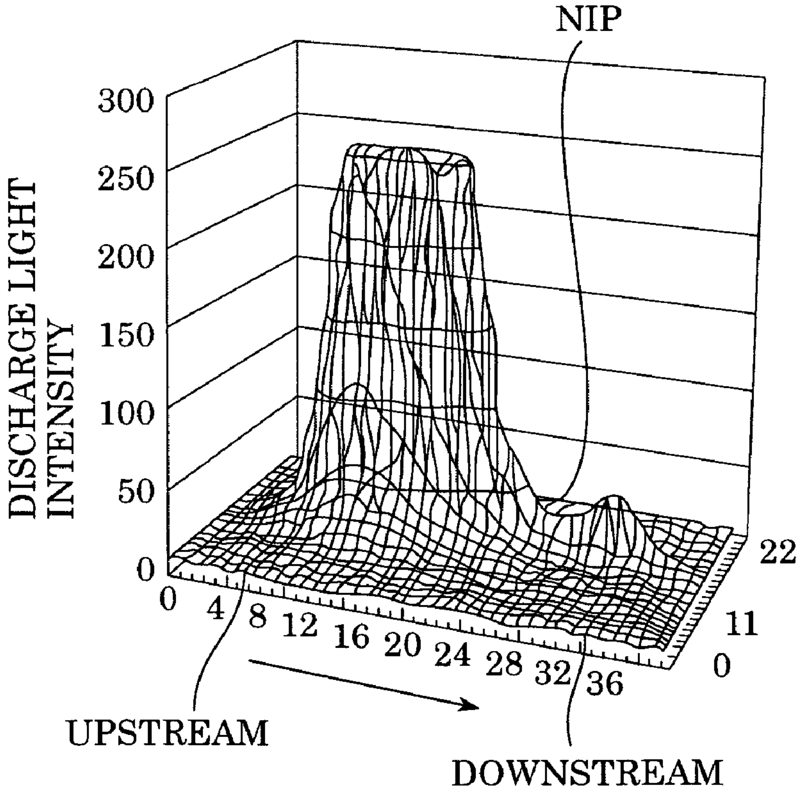
Figure 17:
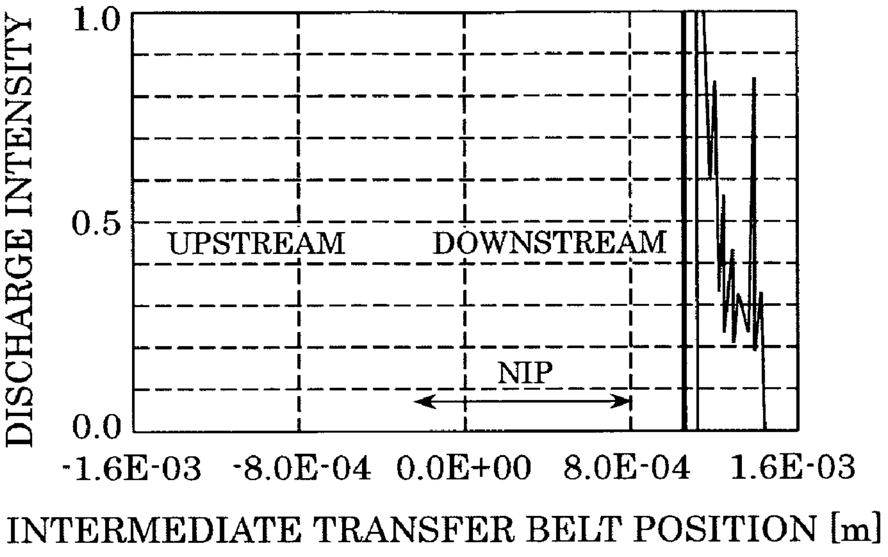
FIG. 17 includes graphs showing calculation results of the discharge light strength of the transfer roller.
Figure 17:
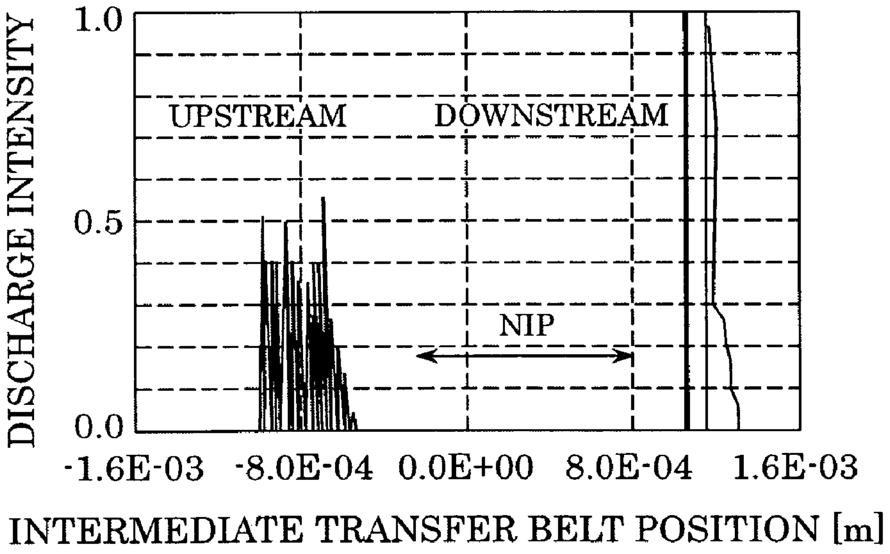

FIGS. 16A and 16B are three-dimensional graphs showing the discharge light intensity of the belts A and C, respectively, yielded by experiment. FIG. 17 includes graphs showing calculation results of the belts A and C, yielded by the analysis method described above. The graphs in FIGS. 16A to 17 show the relationship between the positions on the inner surface of the intermediate transfer belt and the discharge intensity, around the nips of the photosensitive drum and the intermediate transfer belt. The discharge intensity is standardized for display in FIG. 17. The experiment shows that the discharge occurs upstream of the nip only on the belt C whereas slight discharge occurs downstream of the nip on both the belts A and C. Similar results are attained also in the calculation.

Figure 18:
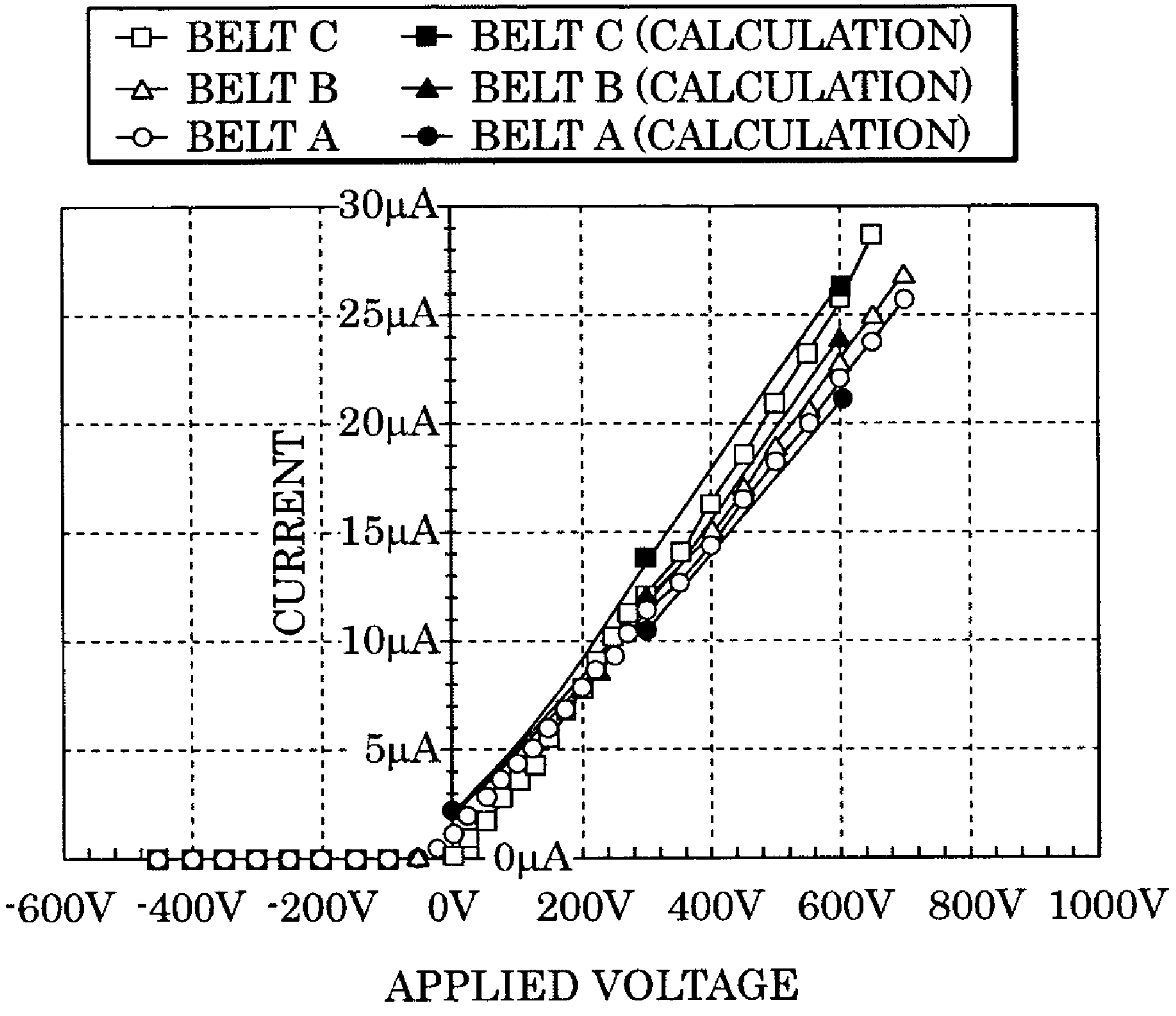
FIG. 18 is a graph showing calculation and experimental results of the amount of discharge when the toner is not transferred to the transfer roller.
Figure 19:
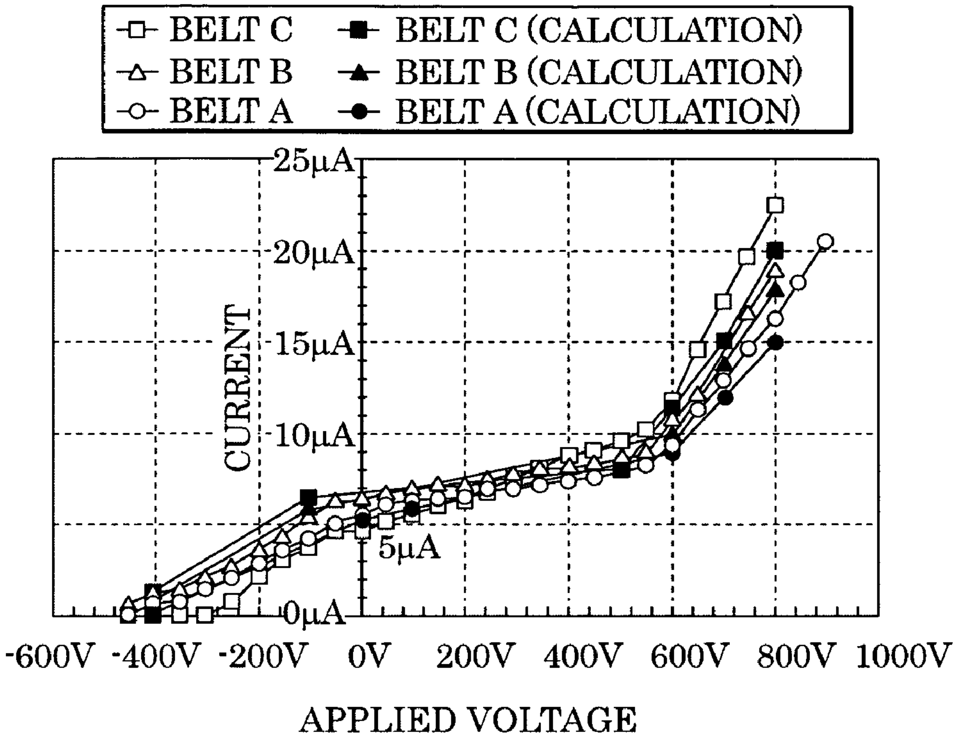
FIG. 19 is a graph showing calculation and experimental results of the amount of discharge when the toner is transferred to the transfer roller.

FIGS. 18 and 19 are graphs showing the relationships between the voltages actually applied to the transfer roller in FIG. 13 and the currents and the relationship between the voltages calculated in the simulation according to this embodiment and the currents. The data plotted in white denotes the experimental results and the data plotted in black denotes the simulation results according to this embodiment. FIG. 18 shows the relationship between the transfer voltage and the current when the toner is not transferred whereas FIG. 19 shows the relationship between the transfer voltage and the current when the toner is transferred. FIGS. 18 and 19 show the results of the three kinds of intermediate transfer belts A, B, and C. The graphs show that the calculation results coincide well with the experimental results on all the belts.

Referring to FIG. 19, the rising edges of the currents at voltages near 600 V are caused by occurrences of the discharge to the toner layer. Some toner particles have the reverse polarization due to the discharge to the toner layer. In other words, although the all the toner particles are negatively charged before the transfer, some toner particles are positively charged after they pass through the nip. As a result, the toner particles having the reverse polarization are not transferred and remain on the photosensitive drum. FIG. 19 shows the ratio of the toner particles remaining on the photosensitive drum due to the reverse polarization, which ratio is precisely calculated. FIG. 19 further shows that the discharge to the toner is correctly calculated in this embodiment.

Figure 20:
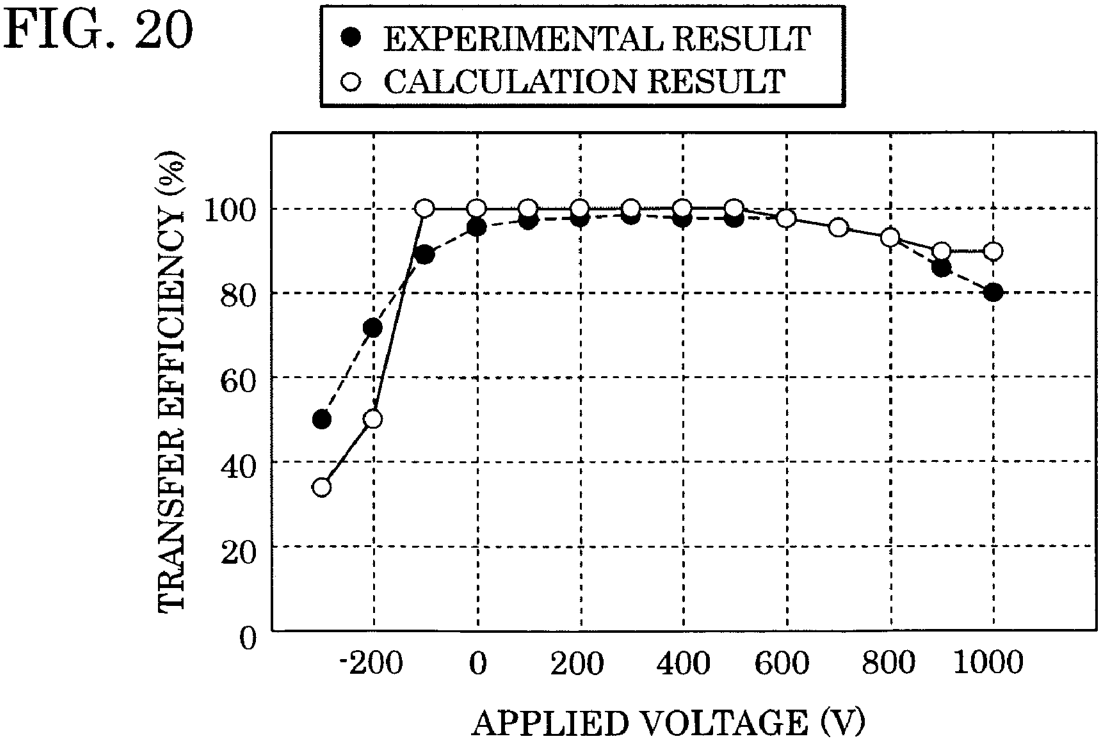
FIG. 20 is a graph showing the relationship between voltages applied to the transfer roller and the transfer efficiency.

FIG. 20 is a graph showing the relationship between voltages applied to the transfer roller apparatus and the transfer efficiency. Referring to FIG. 20, when a voltage larger than or equal to 600 V, at which the discharge starts to occur, is applied, the transfer efficiency decreases.

Table 1 shows conditions set in FIGS. 16A to 19.

TABLE 1

| | Permittivity $\epsilon r'$ | Conductivity $\sigma$ [S/m] | Thickness |
|---|---|---|---|
| Photosensitive layer (drum) | 3 | 0 | 24 μm |
| Intermediate transfer belt | 4.8 | A, B, C | 85 μm |
| Transfer roller | 10 | 3 × 10 − 6 | 4 mm |
| Toner | 2 | 0 | — |
| | $\phi$ 6.8 μm, −22.4 μC/g, The number of layers = 2, 1 g/cm$^3$ | | |
| Potential on surface of drum | VL = −215 V<br>VD = −611 V | | |
| Processing speed | 0.13 m/sec | | |

Since the discharge ordinarily has a large effect on toner spatter in the transfer process, it is very important to predict the discharge.

Analysis by Finite Difference Method

An example in which the finite difference method is used in the electric field calculation will be described below. In the description of the finite difference method, the variables of each cell are defined in the positions shown in FIG. 12. That is, the potential $\phi$ and the charge Q are defined at the center of gravity of a cell and the conductivity $\sigma$ and the permittivity $\in$ are defined at the midpoint of each side between cells. Only the difference from the finite element method will be described and the duplicate description will be omitted here.

In order to separate the finite difference method from the finite element division model, a part corresponding to the element in the finite element method, among the mesh points, is called a cell.

The object motion analysis module B180 will now be described. In the processing in the object motion analysis module B180, a set of cells on the surface of an apparatus model, on which surface electric charge is possibly accumulated, is referred to as the charged surface. As in the finite element method, the true charge and the polarization charge are moved between the cells on the charged surface by an amount corresponding to the amount of the movement of the object (toner particle) for every predetermined time that has elapsed from the starting time of the simulation.

The toner permittivity analysis module B120 will now be described. In the processing in the toner permittivity analysis module B120, as in the finite element method, the permittivity of each cell is calculated by the method shown in FIG. 6 and Formulas 5 and 6. The average value of the permittivities of the two adjoining cells is used as the permittivity at the boundary between the cells.

The toner charge analysis module B130 will now be described. In the processing in the toner charge analysis module B130, it is assumed that the tone particle has the charge at the center thereof and the charge is applied to the cell closest to the center. Performing this processing for all the toner particles provides the charge distribution for every cell in consideration of the toner charge.

The discharge analysis module B160 will now be described. Since the potential is defined at the center of a cell in the finite difference method described here, the potential definition segment described above corresponds to the cell. Accordingly, the discharge segment described above is referred to as a discharge cell, the discharge search segment to be extracted is referred to as a discharge search cell, the pair of the discharge segments is referred to as a pair of discharge cells, and the toner segment is referred to as a toner cell in this embodiment.

The discharge-between-opposing-faces extraction module B161 will now be described. First, an operator specifies in advance two surfaces between which discharge possibly occurs, among the charged surfaces of the transfer processing apparatus. The CPU 21 extracts the discharge points between the two surfaces from the electric potential distribution for every calculation time step. Since this processing is performed for the cells, the analysis is performed for the positions different from the cells in the finite element method but performed in the same manner as in the finite element method.

Specifically, the CPU 21 extracts all the pairs of discharge cells having voltages larger than the Paschen voltage based on the relationship on the potential between the cells on the charged surface and the cells on the opposite charged surface, and registers the extracted pairs of discharge cells in the RAM 23. The discharge search cells include the cells on both the charged surfaces.

The CPU 21 sets the cells in the surface layer of the toner, instead of the cells on the charged surface, as the discharge search cells in the area where the toner is accumulated on the charged surface. The CPU 21 extracts the discharge search cells in the following sequence.

(1) All the cells on the charged surface are registered in advance as the discharge search cells.

(2) Among the toner particles accumulated on the charged surface, the toner particles in the surface layer are extracted.

(3) The toner cells are extracted and the cells covered with the toner, on the charged surface, are excluded.

Specifically, cells having the centers that are closest to the positions most apart from the charged surface are extracted from the toner particles in the surface layer as the toner cells. The extracted toner cells are added as the discharge search cells. The cells covered with the toner, on the charged surface, are excluded from the discharge search cells.

The CPU 21 extracts the pairs of discharge cells based on the extracted discharge search cells in the same manner as in the finite element method.

In the processing in the discharge-to-pointed-member extraction module B162, when the difference in potential between two discharge search cells is larger than the discharge starting voltage specified by the operator, the CPU 21 registers the two discharge search cells in the RAM 23 as the pairs of discharge cells. This determination is based on the length of the gap between the static charge eliminator and the opposite charged surface and on the difference in potential therebetween.

In the processing in the amount-of-discharge calculation module B163, the CPU 21 calculates the amount of charge that is moved due to the discharge between the pairs of discharge cells on the parallel surfaces opposed to each other and on the pointed member and the opposite surface. The pairs of discharge cells are extracted in the processing in the discharge-between-opposing-faces extraction module B161 and the discharge-to-pointed-member extraction module B162.

In the finite difference method, an orthogonal mesh is generated in a Cartesian coordinate system (xy coordinate system) and the generated orthogonal mesh is converted into a general coordinate system (ζη coordinate system) by using Formulae 14 and 15. Solving a Poisson equation in Formula 13 in the general coordinate system gives the electric potential distribution. In Formulas 13, 14, and 15, ζ1=ζ, ζ2=η, $g^{ij}$ denotes a metric tensor, $\sqrt{g}$ denotes a Jacobian for coordinate transformation, q denotes an electric charge density, ∈ denotes a permittivity, and ϕ denotes a potential.

$$\frac{1}{\sqrt{g}}\frac{\partial}{\partial\xi^i}\sqrt{g}\left(\varepsilon g^{ij}\frac{\partial\phi}{\partial\xi^j}\right)=-q \qquad i=1,2 \quad j=1,2$$ [Formula 13]

$$(g^{ij})=\frac{1}{g}\begin{bmatrix} x_\eta^2+y_\eta^2 & -x_\xi x_\eta-y_\xi y_\eta \\ -x_\xi x_\eta-y_\xi y_\eta & x_\xi^2+y_\xi^2 \end{bmatrix}$$ [Formula 14]

$$\sqrt{g}=x_\zeta x_\eta-y_\eta y_\zeta$$ [Formula 15]

Formula 16 is simultaneous linear equations that make Formula 13 effect in the entire analysis area. In Formula 16, m denotes the number of unknown cells.

$$\begin{bmatrix} M_{11} & \cdots & M_{1m} \\ \vdots & \ddots & \vdots \\ M_{m1} & \cdots & M_{mm} \end{bmatrix}\begin{Bmatrix} \phi_1 \\ \vdots \\ \phi_m \end{Bmatrix}=\begin{Bmatrix} Q_1 \\ \vdots \\ Q_m \end{Bmatrix}$$ [Formula 16]

In the following description, the potential vector and the charge vector before the discharge are denoted by {ϕ} and {Q}, respectively, and the potential vector and the charge vector after the discharge are denoted by {ϕ'} and {Q'}, respectively. The amounts of charge, before the discharge, of the pairs of discharge cells i and j are denoted by Qi and Qj, respectively. Movement of the charge by an amount ΔQij from the cell i to the cell j due to the discharge generates a difference αVth in potential between the two cells. The Vth (ij) denotes a discharge starting voltage in the length of the gap between the both the cells. The Vth(ij) is equal to a Paschen voltage when the pair of discharge cells is extracted in the discharge-between-opposing-faces extraction module B161, whereas the Vth(ij) is equal to the above discharge starting voltage yielded by experiment when the pair of discharge cells is extracted in the discharge-to-pointed-member extraction module B162. α denotes a coefficient indicating the ratio of a potential drop with respect to the Paschen voltage after the discharge. α ordinarily has a value of one.

The potentials ϕi' and ϕj' of the cells i and j after the discharge have the relationship shown in Formula 3. The amounts of charge Qi' and Qj' are calculated by using Formula 4. Incorporating Formula 3 and Formula 4 into Formula 16 gives an electric field equation after the discharge shown in Formula 17.

$$\begin{bmatrix} M_{11} & \cdots & M_{1i} & \cdots & M_{1j} & \cdots & M_{1m} \\ \vdots & & \vdots & & \vdots & & \vdots \\ M_{i1} & \cdots & M_{ii} & \cdots & M_{ij} & \cdots & M_{im} \\ \vdots & & \vdots & & \vdots & & \vdots \\ M_{j1} & \cdots & M_{ji} & \cdots & M_{jj} & \cdots & M_{jm} \\ \vdots & & \vdots & & \vdots & & \vdots \\ M_{m1} & \cdots & M_{mi} & \cdots & M_{mj} & \cdots & M_{mm} \\ \hline 0 & \underset{0}{\cdots} & 1 & \underset{0}{\cdots} & -1 & \underset{0}{\cdots} & 0 \end{bmatrix}\begin{Bmatrix} \phi'_1 \\ \vdots \\ \phi'_i \\ \vdots \\ \phi'_j \\ \vdots \\ \phi'_m \end{Bmatrix}=\begin{Bmatrix} Q_1 \\ \vdots \\ Q'_i \\ \vdots \\ Q'_j \\ \vdots \\ Q'_m \\ \hline \alpha V_{th}^{(ij)} \end{Bmatrix}$$ [Formula 17]

-continued $$
= \begin{Bmatrix} Q_1 \\ \vdots \\ Q_i - \Delta Q_{ij} \\ \vdots \\ Q_j + \Delta Q_{ij} \\ \vdots \\ Q_m \\ \hline \alpha V_{th}^{(ij)} \end{Bmatrix}
$$

where " . . . " in the m+1-th line are equal to zero.

Moving the ΔQij in the right-hand side vector to the left-hand side matrix gives Formula 18.

[Formula 18]

$$
\left[\begin{array}{ccccccc|c} M_{11} & \cdots & M_{1i} & \cdots & M_{1j} & \cdots & M_{1m} & 0 \\ \vdots & & \vdots & & \vdots & & \vdots & \vdots_0 \\ M_{i1} & \cdots & M_{ii} & \cdots & M_{ij} & \cdots & M_{im} & 1 \\ \vdots & & \vdots & & \vdots & & \vdots & \vdots_0 \\ M_{j1} & \cdots & M_{ji} & \cdots & M_{jj} & \cdots & M_{jm} & -1 \\ \vdots & & \vdots & & \vdots & & \vdots & \vdots_0 \\ M_{m1} & \cdots & M_{mi} & \cdots & M_{mj} & \cdots & M_{mm} & 0 \\ \hline 0 & \overset{\cdots}{_0} & 1 & \overset{\cdots}{_0} & -1 & \overset{\cdots}{_0} & 0 & 0 \end{array}\right] \begin{Bmatrix} \phi_1' \\ \vdots \\ \phi_i' \\ \vdots \\ \phi_j' \\ \vdots \\ \phi_m' \\ \hline \Delta Q_{ij} \end{Bmatrix} = \begin{Bmatrix} Q_1 \\ \vdots \\ Q_i \\ \vdots \\ Q_j \\ \vdots \\ Q_m \\ \hline \alpha V_{th}^{(ij)} \end{Bmatrix}
$$

where " . . . " in the m+1-th line and the m+1-th column are equal to zero. M in Formulae 17 and 18 denotes a coefficient dependent on the left-hand side in Formula 2.

The left-hand side matrix in Formula 18 is given by adding one line having 1 and −1 in the two columns corresponding to the discharge cell numbers and having zero in other elements and one column symmetric to the added line to the matrix in Formula 16. When there are multiple pairs of discharge cells, the line and column outside the m×m of the matrix are repeated by the number of pairs of discharge cells. The CPU 21 calculates Formula 18 to provide the potential {φ'} and the amount of discharge {ΔQ} after the discharge. With respect to the cells other than the toner cells, that is, the cells on the charged surface, among the discharge cells, the amount of charge after the discharge is calculated by using Formula 4 and the previous amount of charge is updated to the calculated amount of charge.

Since the left-hand side matrix in Formula 18 is a symmetric sparse matrix, it can be rapidly solved.

In the processing in the toner charge update module B164, when the cell where the discharge occurs is a toner cell, the CPU 21 adds the amount of discharge calculated in the amount-of-discharge calculation module B163 to the amount of charge of the toner from which the toner cell is extracted, and updates the amount of charge to the calculated amount of charge. Since a correspondence table between the toner cells and the toner numbers is required, the correspondence table is created in advance in the discharge-between-opposing-faces extraction module B161.

The processing in the toner behavior analysis module B170 is the same as in the finite element method except that the result concerning the electric field yielded in the finite difference method is used in the calculation of the electric field strength at the center of the toner particle in Formula 11. Accordingly, a detailed description is omitted here.

Also in the electric field calculation using the finite difference method according to this embodiment, the transfer analysis can be performed in consideration of the current flowing through the conductor, the discharge, and the behavior of the toner in accordance with the flowchart in FIG. 3 by using the modules shown in FIG. 2. Particularly, the analysis by the finite difference method has the advantage in that it is easy to understand the physical meaning of the content of the calculation and the high-speed calculation can be realized, compared with the analysis by the finite element method.

Figure 12:
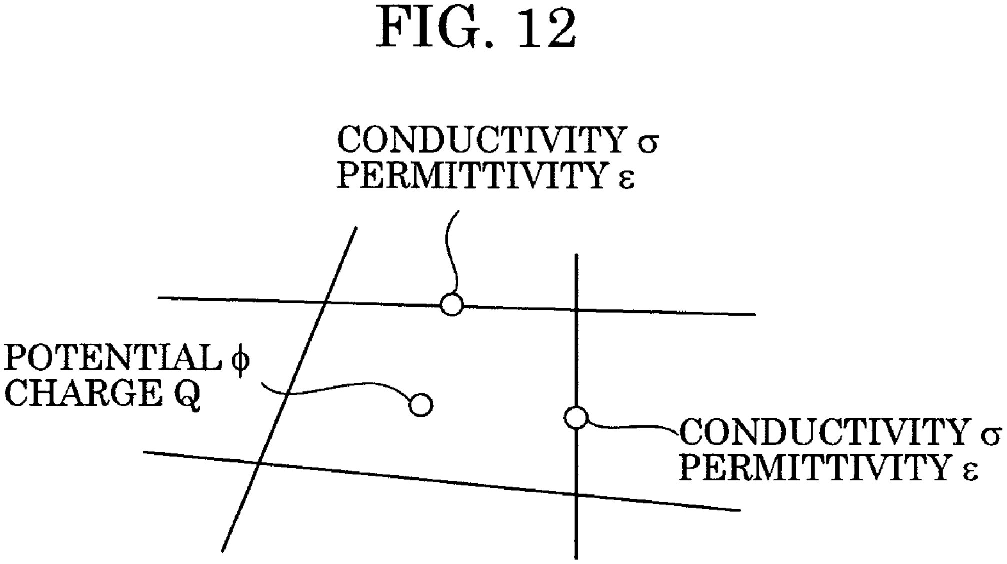
FIG. 12 shows an example of the definition of parameters of an element.

Although the finite difference method in which the potential and the amount of charge are defined at the center of a cell and the permittivity and the conductivity are defined at the boundaries between cells is described, as shown in FIG. 12, this embodiment is applicable to other definitions.

Although the finite element method and the finite difference method are used in the electric field calculation according to the above embodiments, the present invention is not limited to such calculation. The present invention is applicable to the electric field calculation using other methods, such as integration.

Simulation Process of Electric Potential Distribution

Figure 21:
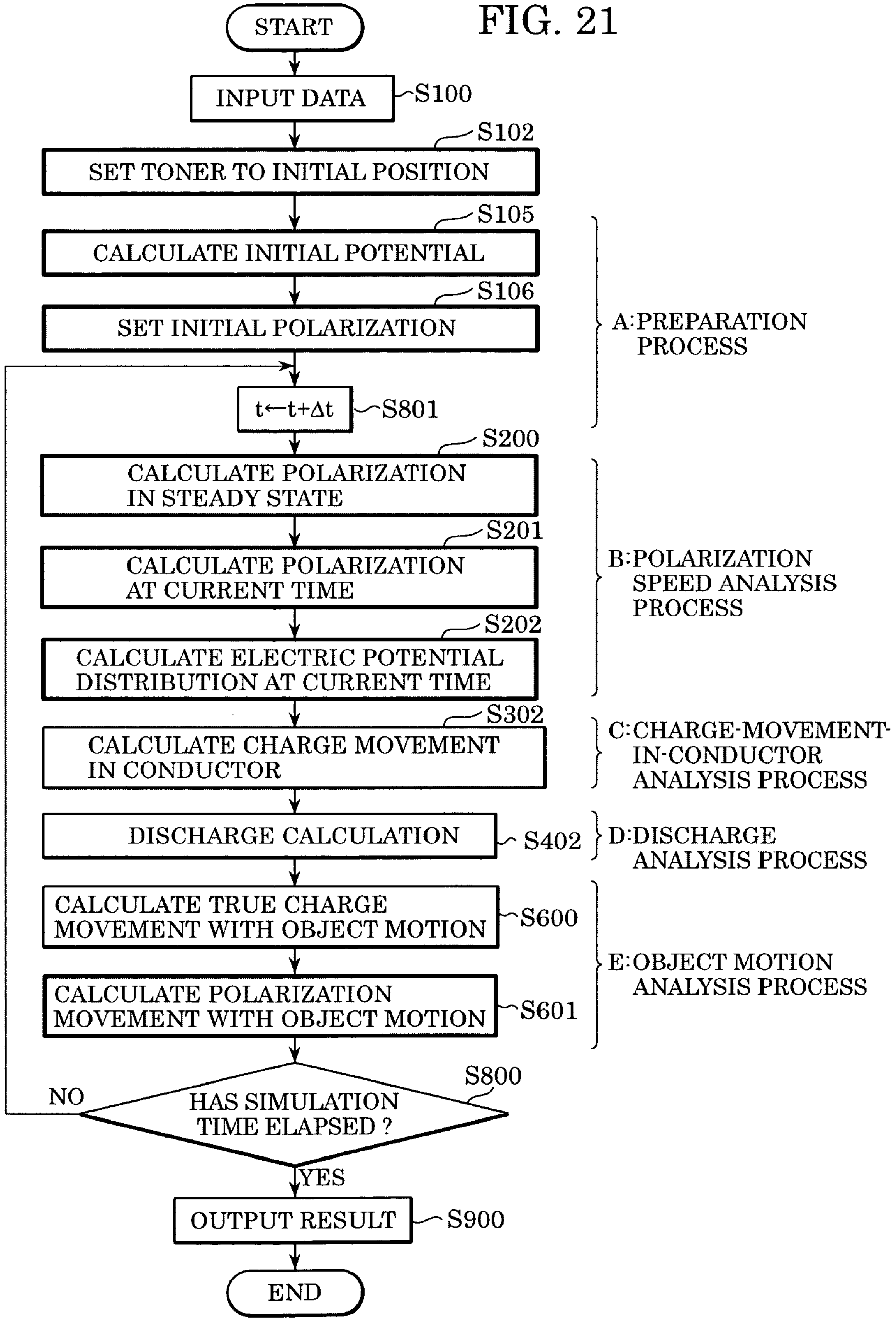
FIG. 21 is a flowchart showing a simulation process of electric potential distribution in the information processing apparatus, according to an embodiment of the present invention.

A simulation process of the electric potential distribution according to an embodiment of the present invention will now be described. FIG. 21 is a flowchart showing a simulation process of the electric potential distribution in the toner transfer apparatus. The simulation process of the electric potential distribution is performed by executing the modules shown in FIG. 2.

In Step S100, the CPU 21 reads input data (the data input module B110). Simultaneously, the CPU 21 sets an initial charge distribution of, for example, latent images on the photosensitive drum. In Step S102, the CPU 21 sets the toner to an initial position in accordance with the conditions of the input data. In Step S105, the CPU 21 calculates the electric potential distribution in an initial state in the electric-potential-distribution calculation module B142. In Step S106, the CPU 21 sets the polarization distribution of the material at the time of starting the calculation in consideration of the polarization speed in initial polarization setting module B141. Steps S100 to S106 are defined as A: preparation process for the calculation with time.

In Step S801, the CPU 21 adds Δt as the simulation time. In Step S200, the CPU 21 calculates the polarization at the steady state in the steady-polarization calculation module B143. The dielectric polarization generated when the material is left under the current electric field strength until it reaches the steady state is calculated in Step S200.

In Step S201, the CPU 21 calculates the polarization at the current time in the current-polarization calculation module B144. The polarization distribution at the current calculation time step is calculated in Step S201. In Step S202, the CPU 21 calculates the electric potential distribution at the current time in the electric-potential-distribution calculation module B142. The polarization distribution at the current calculation time step is used to calculate the electric potential distribution in Step S202. Steps from S200 to S202 are defined as B: polarization speed analysis process.

In Step S302, the CPU 21 uses the yielded electric potential distribution and polarization distribution to calculate an amount of charge movement in the conductor in the charge-movement-in-conductor analysis module B150, and updates the data concerning the electric potential distribution and the polarization distribution in RAM 23. Step S302 is defined as C: charge-movement-in-conductor analysis process.

In Step S402, the CPU 21 calculates the amount of charge that is moved due to the discharge and the electric potential distribution after the discharge in the discharge analysis module B160. Step S402 is defined as C: discharge analysis process.

In Step S600, the CPU 21 calculates the movement of the true charge with the object's motion in the object motion analysis module B180. In Step S601, the CPU 21 calculates the movement of the polarization with the object's motion in the polarization movement module B182. Steps S600 and S601 are defined as E: object motion analysis process.

In Step S800, the CPU 21 determines whether a predetermined simulation time has elapsed. If the predetermined simulation time has not elapsed, the CPU 21 goes back to Step S801 to perform simulation at a time given by adding Δt to the previous simulation starting time. The CPU 21 repeats the above processing until the predetermined time has elapsed. Then, in Step S900, the CPU 21 outputs the results of the simulation at the calculation ending time in the calculation result output module B200.

Since the flowchart shown here is only an example, it is not necessary to strictly keep the order of the steps in order to perform the present invention.

Figure 22:
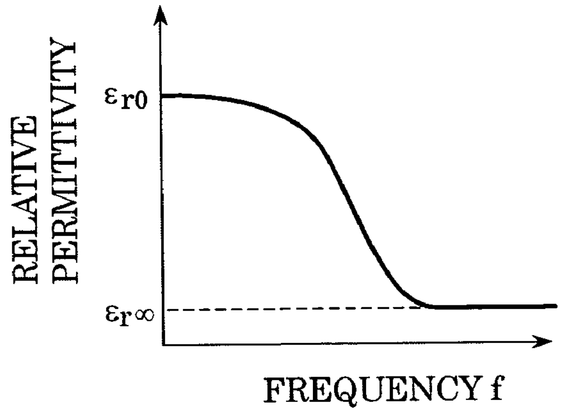
FIG. 22 is a graph showing the dependence on the frequency of the permittivity of a dielectric member in an apparatus to be analyzed.

The polarization speed analysis module B140 will now be described. The relative permittivity of the material, affected by the speed of the dielectric polarization, ordinarily has the dependence on the frequency as shown in FIG. 22. The value of the relative permittivity at lower frequencies is denoted by $\in_{\gamma 0}$ and the value of the relative permittivity at higher frequencies is denoted by $\in_{\gamma\infty}$. τ denotes the time constant as an index of the polarization speed and is yielded by experiment.

The CPU 21 varies the dielectric polarization (accurately, the polarization on the basis of the initial polarization upon application of the electric field) with time in the polarization speed analysis module B140, on the assumption that the dielectric polarization exponentially grows in a predetermined electric field, as shown in Formula 21. In Formula 21, $$\vec{P} \quad \text{[Formula 19]}$$

denotes the polarization, $$\vec{P}_{\infty} \quad \text{[Formula 20]}$$

denotes the polarization at the steady state in the electric field, and t denotes a time.

$$\vec{P} = \vec{P}_{\infty}\left(1 - e^{-\frac{t}{\tau}}\right) \quad \text{[Formula 21]}$$

Expressing Formula 21 in a recurrence relation with respect to time gives Formula 22. The values in upper-right angle brackets denote calculation time step numbers (indicating how many times the loop in Steps S801 to S800 is repeated). A value ∞ in the upper-right angle bracket indicates the polarization in the steady state upon application of the electric field. Δt denotes the calculation pitch.

$$\vec{P}^{<k+1>} = \vec{P}^{<k>} + \left(\vec{P}^{<\infty>} - \vec{P}^{<k>}\right) \cdot \frac{\Delta t}{\tau}. \quad \text{[Formula 22]}$$

Formula 24 is a Poisson equation. Formula 24 is changed to Formula 25 when the polarization is taken into account. The polarization in Formula 25

$$\vec{P} \quad \text{[Formula 23]}$$

is calculated by using Formula 22 to yield the electric potential distribution ϕ. In Formulae 24 and 25, ∈ denotes the permittivity, ∈0 denotes the permittivity ∈ in the vacuum, and ρ denotes the true charge density.

$$\mathrm{div}(\in \cdot \mathrm{grad}\phi) = -\rho \quad \text{[Formula 24]}$$

$$\mathrm{div}\in 0 \in_{r\infty} \mathrm{grad}\phi = -\rho + \mathrm{div}\vec{P} \quad \text{[Formula 25]}$$

A specific example of a process of calculating the variation in electric field with time in consideration of the polarization speed will now be described.

First, a Poisson equation in Formula 26 is calculated under the condition in Formula 27 in order to yield an initial potential ϕ <0> in Step S105. In the setting of the initial polarization in Step S106, the CPU 21 sets the initial polarization to zero. With respect to a material having an extremely high-speed polarization, which can be ignored, τ is set to zero and the relative permittivity of the material is denoted by ∈γ.

$$\mathrm{div}(\in_x \mathrm{grad}\phi^{<0>}) = -\rho \quad \text{[Formula 26]}$$

$$\begin{cases} \text{In the case of the material having } \tau \neq 0\text{: } \varepsilon_x = \varepsilon_0 \varepsilon_{r\infty} \\ \text{In the case of the material having } \tau = 0\text{: } \varepsilon_x \neq \varepsilon_0 \ _r \end{cases} \quad \text{[Formula 27]}$$

In the calculation of the polarization in the steady state in Step S200, assigning a potential ϕ <κ> at the previous time step in Formula 29 under the condition of Formula 30 provides the polarization $$\vec{P}^{<\infty>} \quad \text{[Formula 28]}$$

in the steady state.

$$\vec{P}^{<\infty>} = \in_x \mathrm{grad}\phi^{<k>} \quad \text{[Formula 29]}$$

$$\begin{cases} \text{In the case of the material having } \tau \neq 0\text{: } \varepsilon_x = \varepsilon_0 \varepsilon_{r\infty} \\ \text{In the case of the material having } \tau = 0: \varepsilon_x = 0 \end{cases} \quad \text{[Formula 32]}$$

In the calculation of the polarization at the current time in Step S201, the polarization is updated by using Formula 22. In the calculation of the electric potential distribution at the current time in Step S202, the calculated polarization $$\vec{P}^{<K+1>} \quad \text{[Formula 31]}$$

is used to yield electric potential distribution φ <κ+1> by using Formula 32.

$$\begin{cases} \text{In the case of the material having} \\ \tau \neq 0\text{: } div\varepsilon grad\phi^{<k+1>} = -\rho + div\vec{P}^{<k+1>} \\ \text{In the case of the material having} \\ \tau = 0\text{: } div\varepsilon_0\varepsilon_r grad\phi^{<k+1>} = -\rho \end{cases} \quad \text{[Formula 30]}$$

Figure 23:
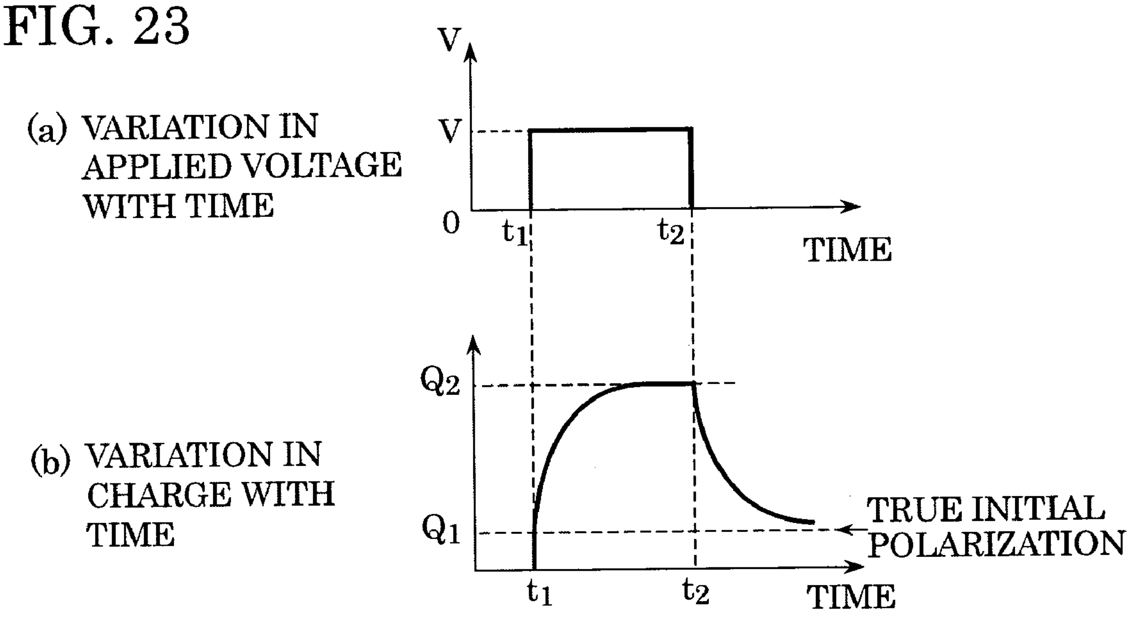
FIG. 23 includes graphs showing the variation with time in the charge accumulated in a capacitor made of a material affected by polarization speed.
Figure 24:
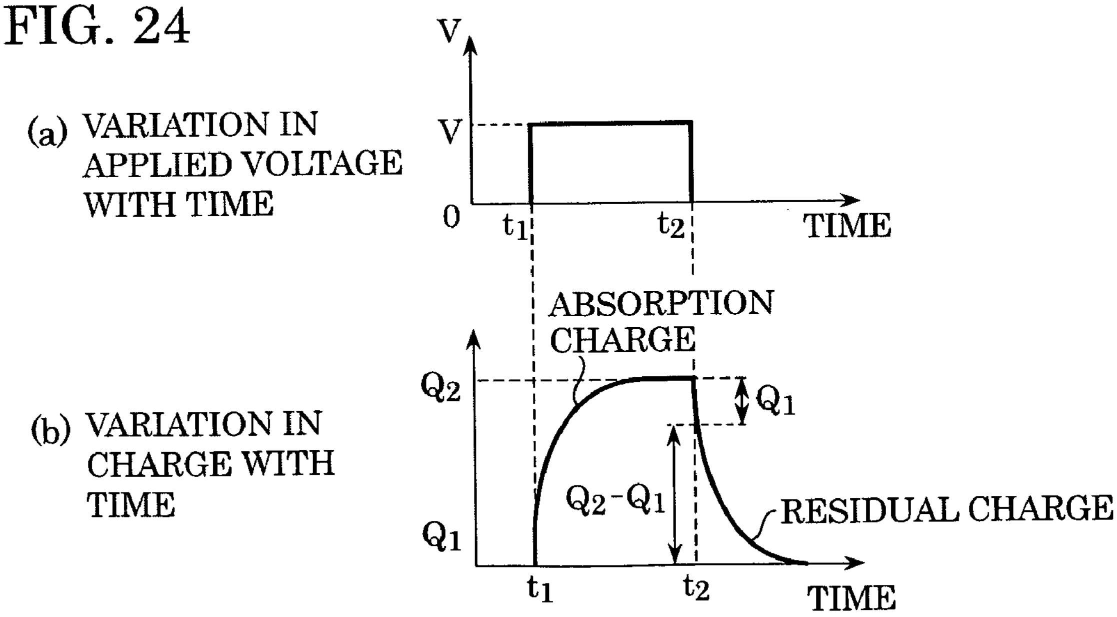
FIG. 24 includes graphs showing the variation with time in the charge accumulated in a capacitor made of a material affected by polarization speed in a related art.

The dielectric polarizations in the above Formulae $$\vec{P},\ \vec{P}_{\infty},\ \vec{P}^{<k>},\ \vec{P}^{<k+1>},\ \vec{P}^{<\infty>} \quad \text{[Formula 33]}$$

are not equal to the normal polarization and are based on the initial polarization upon application of the electric field. In the above method, the charge is accumulated in a condenser when a step voltage is applied, as shown in FIG. 23. Specifically, the charge is accumulated by an amount Q1 upon application of the voltage, the accumulated charge increases with time, and the charge remains constant at Q2. In the removal of the voltage, the charge decreases with time and finally falls into Q1. The polarization becomes zero with the charge being at Q1. This state corresponds to the normal initial polarization state. The above dielectric polarizations can be expressed as the normal polarization by changing the above relative permittivity ∈γ∞ at higher frequencies to one. However, since Formula 34 is actually satisfied, both the polarizations make little difference.

$$\epsilon_{r\infty} \approx 1 \quad \text{[Formula 34]}$$

Although Formula 21 is based on the assumption that the polarization in the dielectric material upon application of the electric field exponentially comes close to the polarization in the steady state at the electric field strength at this time, the experimental result may be adopted or a function approximating the experimental result may used. For example, the waveform of the absorption charge or the residual charge upon application of the above step voltage may be used.

The initial polarization is set zero in the setting of the initial polarization in Step S106. However, when the polarization in the steady state at the foregoing calculation time step is known, the initial polarization may be set to the known polarization in the steady state. This setting allows the electric potential distribution over time iteration to be set to the steady state more rapidly.

Although the case in which the polarization varies with time due to the electric field is described above, this embodiment is not limited to this relationship between the electric field and the polarization. The simulation process of the electric potential distribution according to this embodiment may be used as a method of simulating a field, which is an area including an object whose physical property varies with time. Although the polarization in the above description means the physical property, which is the permittivity of an object, the simulation process according to this embodiment is applicable to various phenomena by substituting a normal field and a physical property for the electric field and the permittivity, respectively.

Analysis by Finite Element Method

A case in which the finite element method is adopted as the method of performing the electric field calculation in the analysis according to this embodiment will be exemplified below. The description is limited to the two-dimensional analysis here.

When a Poisson equation in Formula 21 is solved by the finite element method, a potential φ and an electric charge (including polarization charge) Q are defined as values of a node, which is an apex of an element produced by the mesh division, and a permittivity ∈ is defined as a value of the element.

Typical parts of this embodiment in the flowchart in FIG. 21 will be described in detail below.

The polarization speed analysis process will now be described. The polarization in Formula 22 is to be shown in an expression using the polarization distribution (accurately, the polarization distribution based on the initial polarization at t=0 when a voltage is applied in the simulation) in Formula 35. The use of the polarization distribution changes Formula 22 to Formula 36. In Formulas 35 and 36, $\rho_p$ denotes a polarization charge density shown in Formula 37. ∈γ denotes a relative permittivity.

$$\rho_p^{<k+1>} = \rho_p^{<k>} + (\rho_p^{<\infty>} - \rho_p^{<k>}) \cdot \frac{\Delta t}{\tau} \quad \text{[Formula 35]}$$

$$\mathrm{div}(\epsilon_0\epsilon_{r\infty}\mathrm{grad}\phi) = -(\rho+\rho_p) \quad \text{[Formula 36]}$$

$$\rho_p = \mathrm{div}\{\epsilon_0(\epsilon_r - \epsilon_{r\infty})\mathrm{grad}\phi\} \quad \text{[Formula 37]}$$

An example of the polarization speed analysis process of calculating the variation in potential with time in consideration of the polarization speed will be described in detail. In the calculation of the initial potential in Step S105, Formula 26 is solved under the condition in Formula 27 to yield an initial potential distribution φ<0>. In the setting of the initial polarization in Step S106, the initial value $\rho_p$<0> of the polarization is set to zero.

κ is equal to zero. In the calculation of the polarization in the steady state in Step S200, Formula 38 is solved under the condition in Formula 39 to yield the polarization charge $\rho_p$<∞> in the steady state at the current electric field. In the calculation of the polarization at the current time in Step S201, Formula 35 is used to yield new polarization charge $\rho_p$<κ+1>.

$$\rho_p^{<\infty>} = \mathrm{div}(\epsilon_x \mathrm{grad}\phi^{<\kappa>}) \quad \text{[Formula 38]}$$

$$\begin{cases} \text{In the case of the material having} \\ \tau \neq 0\text{: } \varepsilon_x = \varepsilon_0(\varepsilon_{r0} - \varepsilon_{r\infty}) \\ \text{In the case of the material having} \\ \tau = 0\text{: } \varepsilon_x = 0 \end{cases} \quad \text{[Formula 39]}$$

Formula 40 is solved to yield the electric potential distribution at the current time in Step S202 based on the yielded polarization charge $\rho p^{<\kappa+1>}$.

$$\begin{cases} \text{In the case of the material having} \\ \tau \neq 0\text{: } div(\varepsilon_0\varepsilon_{r\infty} grad\phi^{<k+1>}) = -(\rho + \rho_p^{<k+1>}) \\ \text{In the case of the material having} \\ \tau = 0\text{: } div(\varepsilon_0\varepsilon_{r0} grad\phi^{<k+1>}) = -\rho \end{cases} \quad \text{[Formula 40]}$$

This calculation provides new polarization distribution φ <κ+1> after updating the polarization.

A specific method of solving the expressions described above will be described. Methods of solving Formula 24, which is a Poisson equation, by the finite element method are common. Formula 41, which is given by discretizing the Poisson equation in Formula 24 by the finite element method, is simultaneous linear equations coming into effect in the entire analysis area. This equation is called an overall liner equation where n denotes the number of nodes, "K" in the left-hand side forms a coefficient matrix, and {Q} in the right-hand side is the charge vector of each node.

$$\begin{bmatrix} K_{11} & \cdots & K_{1n} \\ \vdots & \ddots & \vdots \\ K_{n1} & \cdots & K_{nn} \end{bmatrix} \begin{Bmatrix} \phi_1 \\ \vdots \\ \phi_n \end{Bmatrix} = \begin{Bmatrix} Q_1 \\ \vdots \\ Q_n \end{Bmatrix} \quad \text{[Formula 41]}$$

Formula 44 is given by substituting σ for the permittivity ∈ in Formula 24. Accordingly, in the process of creating the matrix in the left-hand side in Formula 41, the overall equation in the finite element method is created by using σ, instead of the permittivity ∈, and the created equation is solved to yield the initial potential {ϕ <0>} of each node. The right-hand side of Formula 38 is given by substituting Formula 39 for the permittivity ∈ in the left-hand side of Formula 24. Accordingly, in the process of creating the coefficient matrix [K] in the overall equation of the finite element method in Formula 41, multiplying the coefficient matrix given by using the value in Formula 39, instead of permittivity ∈, by the electric potential distribution {ϕ <κ>} given by Formula 44 or Formula 40 provides the polarization charge {ρ <κ>} of each node.

With respect to Formula 40, formulating a submatrix equation for every element in accordance with the time constant τ (whether it is necessary to consider the polarization speed) of the polarization speed of the corresponding material and solving an overall equation given by combining the submatrix equations provide the electric potential distribution {ϕ <κ>} of each node.

The process of solving the overall equation given by formulating the submatrix equation for every element and combining the submatrix equations is similar to the process of formulating Formula 41. Specifically, in the process of creating the coefficient matrix, $\in_0\in_{\gamma\infty}$ is used for the element having τ that is not equal to zero (τ≠0) and $\in_0\in_\gamma$ is used for the element having τ that is equal to zero (τ=0), instead of the permittivity ∈. For the element having τ that is not equal to zero (τ≠0), the right-hand side vector is set to a value given by adding the polarization charge of each node, yielded in the calculation of the polarization at the current time in Step S201, to the true charge of the node.

With the method described above, it is possible to easily consider the speed of the dielectric polarization in the same manner as the common method of processing the coefficient matrix of the finite element method.

In the charge-movement-in-conductor analysis process, the variation in charge of each node is calculated by using Formula 44, which is the Ohm's law and the low of conservation of charge, and the amount of charge of each node is updated. Formula 44 is given by substituting σ for the permittivity ∈ in the Poisson equation in Formula 24. Accordingly, in the process of creating the matrix in Formula 41, which is the overall equation of the finite element method to solve Formula 24, multiplying the coefficient matrix given by using σ, instead of permittivity ∈, by the electric potential distribution {ϕ <κ>} given by the calculation of the electric potential distribution at the current time in Step S202 provides the variation in potential of each node, shown in Formula 42.

$$\left\{\frac{\partial \rho}{\partial t}\right\} \quad \text{[Formula 42]}$$

In other words, $$\left\{\frac{\partial \rho}{\partial t}\right\} \quad \text{[Formula 43]}$$

is yielded from the electric potential distribution {ϕ <κ>}. Formula 40 is solved based on the polarization charge calculated in the polarization speed analysis process and the true charge of each node, calculated here, to yield the electric potential distribution after the charge moves in the conductor.

$$div(\sigma \cdot grad\phi) = -\frac{\partial \rho}{\partial t} \quad \text{[Formula 44]}$$

In the discharge analysis process, the CPU 21 calculates the discharge based on the electric potential distribution of each node, yielded in the charge-movement-in-conductor analysis process, and updates the distribution of the charge (true charge). The CPU 21, then, solves Formula 40 based on the polarization charge calculated in the polarization speed analysis process and the true charge of each node, calculated here, to calculate the electric potential distribution after the charge. As a result, the electric potential distribution for every simulation time Δt is yielded.

The object motion analysis process will now be described. The electric charge ordinarily exists only on the surface of an object, regardless of the true charge or the polarization charge. In the case of the polarization charge, the inner charge is offset and, therefore, becomes zero. A surface of the object, on which surface electric charge is possibly accumulated, is referred to as the charged surface, as described above. When the motion of an object is taken into consideration, the simulation of moving the charge in the direction of the object's motion between nodes on the charged surface should be performed.

Although the rollers actually adhere to the sheet material, as shown in FIG. 4A, it is assumed in the calculation model that there is a narrow gap 54 between the sheet material and the respective rollers, as shown in FIG. 4B. The true charge on the charged surface and the polarization charge on the charged surface are moved in the direction of objects' motion in the surface-charge movement module B181 and the polarization movement module B182, respectively. Since expressing the polarization in Formula 40 as the polarization charge, as in Formula 35, allows the polarization state to be defined as the value of the node, it is sufficient to move the charge on the charged surface in the polarization movement process in the polarization movement module B182, as in the surface-charge movement module B181.

The processing in the polarization speed analysis module B140 allows the member, such as the transfer roller, whose transfer performance is affected by the speed of the dielectric polarization to be considered, thus correctly reproducing actual phenomena.

The processing in the object motion analysis module B180 permits the consideration of the motion of the member whose polarization speed is to be considered.

In the object motion analysis process, the motion of the object is simulated by moving the charge on the charged surface between nodes. This processing may be performed by a method in which the polarization is processed as the value of the element and the finite element division model is shifted between two moving objects or by a method in which the material distribution is shifted to simulate the motion of the object, by using Formulas 44, 9, 11, 12, and 14.

Although the two-dimensional analysis is described above, the embodiments of the present invention is applicable to three-dimensional analysis.

Analysis by Finite Difference Method

An example in which the finite difference method is used in the electric field calculation will be described below. In the description of the finite difference method, the variables of each cell are defined in the positions shown in FIG. 12. That is, the potential ϕ and the charge Q are defined at the center of gravity of a cell and the conductivity σ and the permittivity ∈ are defined at the midpoint of each side between cells. Only the difference from the finite element method will be described and the duplicate description will be omitted here.

In order to separate the finite difference method from the finite element division model, a part corresponding to the element in the finite element method, among the mesh points, is called a cell.

Before the description of this embodiment is started, a common method of calculating the electric potential distribution by the finite difference method will be described. In the calculation of the electric field by the finite difference method, an orthogonal mesh is generated in the Cartesian coordinate system (xy coordinate system) and the generated orthogonal mesh is converted into the general coordinate system (ζη coordinate system) by using Formulae 46 and 47. Solving a Poisson equation in Formula 45 in the general coordinate system gives the electric potential distribution. In Formulas 45, 46, and 47, ζ1=ζ, ζ2=η, $g^{ij}$ denotes a metric tensor, $\sqrt{g}$ denotes a Jacobian for coordinate transformation, q denotes an electric charge density, ∈ denotes a permittivity, and ϕ denotes a potential. Formula 45 results from Formula 24 after the coordinate transformation.

$$\frac{1}{\sqrt{g}}\frac{\partial}{\partial\xi^i}\sqrt{g}\left(\varepsilon g^{ij}\frac{\partial\phi}{\partial\xi^i}\right)=-q \qquad \text{[Formula 45]}$$

$$i=1,2 \quad j=1,2$$

$$(g^{ij})=\frac{1}{g}\begin{bmatrix} x_\eta^2+y_\eta^2 & -x_\xi x_\eta-y_\xi y_\eta \\ -x_\xi x_\eta-y_\xi y_\eta & x_\xi^2+y_\xi^2 \end{bmatrix} \qquad \text{[Formula 46]}$$

$$\sqrt{\sqrt{g}}=x_{\in}x_{\eta}-y_{\eta}y_{\in} \qquad \text{[Formula 47]}$$

In the polarization speed analysis process, the CPU 21 calculates the dielectric polarization by the finite difference method by using Formulae 35 to 40 in a manner similar to that in calculation of the electric field.

In the calculation of the initial potential in Step S105, Formula 26 is given by substituting ∈ for the permittivity ∈ in Formula 24. Accordingly, the Poisson equation in Formula 27 is solved by using ∈ instead of the permittivity ∈, to yield the initial potential {ϕ <0>} of each cell.

In the calculation of the polarization in the steady state in Step S200, the right-hand side of Formula 38 is given by substituting Formula 39 for the permittivity ∈ in the left-hand side of Formula 24. Accordingly, in the creation of the matrix for solving Formula 45, multiplying the coefficient matrix given by using the value in Formula 39, instead of the permittivity ∈, by the electric potential distribution {ϕ <κ>} given by Formula 44 or 40 provides the polarization charge {ρ <κ>} of each cell.

In the calculation of the electric potential distribution at the current time in Step S202, changing the permittivity and the amount of charge, when the Poisson equation in Formula 45 is solved, in accordance with the time constant (whether it is necessary to consider the polarization speed) of the polarization speed of the material and solving the Formula 40 provides the electric potential distribution {ϕ <κ+1>} of each cell in the same manner as known methods of solving the Poisson equation.

In the processing in the object motion analysis process, a set of cells on the surface of an object, on which surface electric charge is possibly accumulated, is referred to as the charged surface, as described above. The true charge and the polarization charge are moved between cells on the charged surface by an amount corresponding to the amount of the object's motion at the calculation pitch for every calculation time step in the object motion analysis process.

Also in the electric field calculation using the finite difference method according to this embodiment, the electric field analysis can be performed in consideration of the speed of the dielectric polarization in accordance with the flowchart in FIG. 21 by using the modules shown in FIG. 2. Since the analysis according to this embodiment is based on the finite difference method, it is easy to understand the physical meaning of the content of the calculation and the high-speed calculation can be realized, compared with the analysis by the finite element method.

Although the finite difference method in which the potential and the amount of charge are defined at the center of a cell and the permittivity and the conductivity are defined at the boundaries between cells is described, as shown in FIG. 12, this embodiment is applicable to other definitions.

Although the finite element method and the finite difference method are used in the electric field calculation according to the above embodiments, the present invention is not limited to such calculation. The present invention is applicable to the electric field calculation using other methods, such as integration.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-161588 filed May 31, 2004 and Japanese Patent Application No. 2004-161587 filed May 31, 2004, which are hereby incorporated by reference herein.

What is claimed is:

1. An analysis method of analyzing a discharge phenomenon in an information processing apparatus having a readable-writable memory, the method comprising:

calculating differences in potential between nodes on a first surface of a meshed simulation model and the corresponding nodes on a second surface thereof based on a predetermined amount of charge of each node before the discharge and the permittivity of each element of the simulation model;

storing information concerning a pair of nodes having the difference in potential which exceeds a Paschen voltage determined from the distance between the nodes, among the calculated differences in potential, wherein the information is stored in the readable-writable memory of the information processing apparatus; and analyzing an amount of charge that is moved due to the discharge and electric potential distribution after the discharge based on the stored information concerning the pair of nodes and the amount of charge of each node before the discharge and storing the analyzed amount of charge and the electric potential distribution.

2. The analysis method according to claim 1, wherein, when the first surface of the simulation model is a pointed member, differences in potential between nodes of the pointed member and the corresponding nodes on the second surface are calculated, and information concerning a pair of nodes having the difference in potential exceeding a voltage on a gap-length dependent curve of a predetermined discharge starting voltage is stored.

3. The analysis method according to claim 1, wherein, when the simulation model has charged particles at arbitrary positions on the first and second surfaces, nodes on the surfaces of the particles are included in targets for the calculation of the difference in potential.

4. The analysis method according to claim 3, wherein part of the charge of the particles is allocated to the nodes on the surfaces of the particles as the charge of the nodes.

5. The analysis method according to claim 1, wherein nodes on the second surface, the nodes being within a predetermined angle with respect to the normal of the first surface, are included in targets for the calculation of the difference in potential.

6. The analysis method according to claim 1, wherein the polarization in a steady state of the meshed simulation model of the information processing apparatus is calculated for every element, wherein the polarization at a time t+Δ is calculated based on the calculated polarization in the steady state and the polarization at a time t that has elapsed since the time to start applying a voltage, and wherein the amount of charge for every node is calculated based on the electric potential distribution calculated from the calculated polarization at the time t+Δt.

7. An information processing apparatus of analyzing a discharge phenomenon, the information processing apparatus comprising:

a control unit calculating differences in potential between nodes on a first surface of a meshed simulation model and the corresponding nodes on a second surface thereof based on a predetermined amount of charge of each node before the discharge and the permittivity of each element of the simulation model; and a memory storing information concerning a pair of nodes having the difference in potential which exceeds a Paschen voltage determined from the distance between the nodes, among the calculated differences in potential, wherein the control unit analyzes an amount of charge that is moved due to the discharge and electric potential distribution after the discharge based on the information concerning the pair of nodes, stored in the memory, and the amount of charge of each node before the discharge, and stores the analyzed amount of charge and the electric potential distribution in the memory.

8. The information processing apparatus according to claim 7, wherein, when the first surface of the simulation model is a pointed member, the control unit calculates differences in potential between nodes of the pointed member and the corresponding nodes on the second surface, and stores information concerning a pair of nodes having the difference in potential exceeding a voltage on a gap-length dependent curve of a predetermined discharge starting voltage in the memory.

9. The information processing apparatus according to claim 7, wherein, when the simulation model has charged particles at arbitrary positions on the first and second surfaces, the control unit includes nodes on the surfaces of the particles in targets for the calculation of the difference in potential.

10. The information processing apparatus according to claim 9, wherein the control unit allocates part of the charge of the particles to the nodes on the surfaces of the particles as the charge of the nodes.

11. The information processing apparatus according to claim 7, wherein the control unit includes nodes on the second surface, the nodes being within a predetermined angle with respect to the normal of the first surface, in targets for the calculation of the difference in potential.

12. The information processing apparatus according to claim 7, wherein the control unit calculates the polarization in a steady state of the meshed simulation model of the information processing apparatus for every element, wherein the control unit calculates the polarization at a time t+Δ based on the calculated polarization in the steady state and the polarization at a time t that has elapsed since the time to start applying a voltage, and wherein the control unit calculates the amount of charge for every node based on the electric potential distribution calculated from the calculated polarization at the time t+Δt.

* * * * *